(12) United States Patent
Tsurume et al.

(10) Patent No.: US 7,465,596 B2
(45) Date of Patent: Dec. 16, 2008

(54) MANUFACTURING METHOD OF SEMICONDUCTOR DEVICE

(75) Inventors: Takuya Tsurume, Atsugi (JP); Naoto Kusumoto, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 200 days.

(21) Appl. No.: 11/454,851

(22) Filed: Jun. 19, 2006

(65) Prior Publication Data

US 2007/0004178 A1    Jan. 4, 2007

(30) Foreign Application Priority Data

Jun. 30, 2005    (JP)    ............................. 2005-193172

(51) Int. Cl.
*H01L 21/00* (2006.01)
(52) U.S. Cl. .............................. 438/46; 438/22; 438/48; 438/142; 257/E27.001
(58) Field of Classification Search ............... 438/46, 438/22, 48, 142; 257/1–700, E27.001
See application file for complete search history.

(56) References Cited

U.S. PATENT DOCUMENTS

| 7,332,198 | B2 * | 2/2008 | Wang et al. | 427/430.1 |
| 2004/0130877 | A1 * | 7/2004 | Okubora | 361/793 |
| 2004/0164302 | A1 | 8/2004 | Arai et al. | |
| 2005/0067680 | A1 * | 3/2005 | Boon et al. | 257/678 |
| 2006/0046435 | A1 | 3/2006 | Kida | |
| 2007/0004082 | A1 | 1/2007 | Tsurume et al. | |

FOREIGN PATENT DOCUMENTS

| JP | 10-213801 | 8/1998 |
| JP | 2000-117471 | 4/2000 |
| JP | 2004-185779 | 7/2004 |
| JP | 2004-282050 | 10/2004 |
| WO | WO 2006/006611 | 1/2006 |

* cited by examiner

*Primary Examiner*—Walter Lindsay, Jr.
*Assistant Examiner*—Abdulfattah Mustapha
(74) *Attorney, Agent, or Firm*—Eric J. Robinson; Robinson Intellectual Property Law Office, P.C.

(57) ABSTRACT

To provide a semiconductor device including a thinned substrate with high yield. After forming a protective layer in a predetermined portion (at least a portion covering a side surface of a substrate) of the substrate, grinding and polishing of the substrate are performed. In other words, an element layer including a plurality of integrated circuits is formed over one surface of the substrate, the protective layer is formed in contact with at least the side surface of the substrate, and the substrate is thinned (for example, the other surface of the substrate is ground and polished), the protective layer is removed, and the polished substrate and the element layer is divided so as to form stack bodies including a layer provided with at least one of the plurality of integrated circuits.

40 Claims, 13 Drawing Sheets

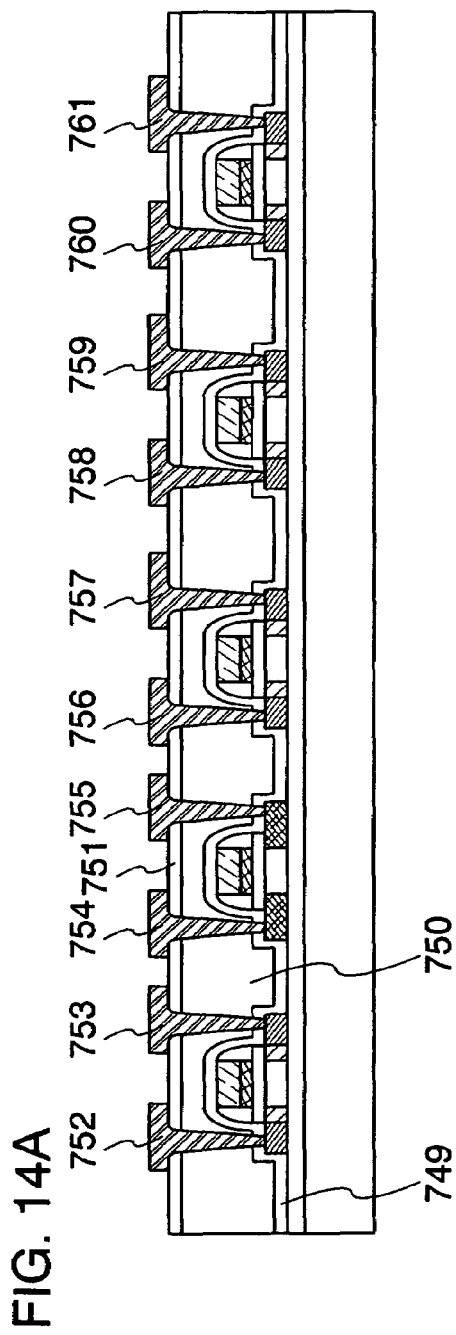
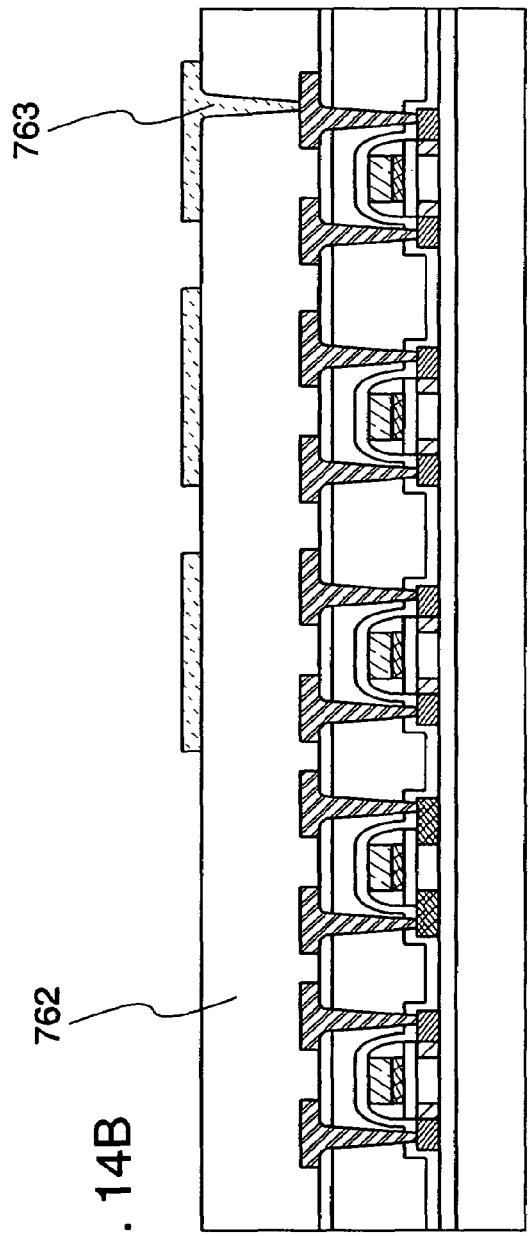
FIG. 14A
FIG. 14B

MANUFACTURING METHOD OF SEMICONDUCTOR DEVICE

This application is based on Japanese Patent Application Ser. No. 2005-193172 filed in Japan Patent Office on Jun. 30, 2005, the entire contents of which are hereby incorporated by reference.

BACKGROUND OF THE INVENTION

1. Field of the Invention

The invention disclosed in this specification relates to a manufacturing method of a semiconductor device.

2. Description of the Related Art

In recent years, a semiconductor device capable of transmitting and receiving data with wireless communication (semiconductor device) has been developed actively. Such a semiconductor device is called an IC tag, an ID tag, an RF (Radio Frequency) tag, an RFID (Radio Frequency Identification) tag, a wireless tag, an electronic tag, a wireless processor, a wireless memory, a wireless chip, or the like (Reference 1: Japanese Patent Laid-Open No. 2004-282050, for example).

In addition, the study and the development for thinning a semiconductor device have been proceeding actively. The thinning of a semiconductor device is a highly important technique for forming a production such as a cellular phone or a digital camera, for which miniaturization is demanded.

Generally, a semiconductor device includes a substrate (for example, a Si wafer, a glass substrate, or the like) and an element layer including a transistor or the like, which is provided over the substrate. The thinning of the substrate for thinning the semiconductor device is attempted.

As a method for thinning a substrate, various techniques are known. For example, there are a chemical treatment method for thinning a substrate by a chemical reaction or the like, and a method for grinding or polishing a substrate.

SUMMARY OF THE INVENTION

Among the methods described above, in the chemical treatment method, weakening of a surface of a glass substrate, where a chemical reaction occurs, is extreme and it is difficult to uniformly control the thickness of the glass substrate.

In addition, among the methods described above, in the method for grinding or polishing a substrate, a chip (chipping) is easily generated at a side surface of the substrate; therefore, a problem of easily generating a crack by thinning a glass substrate is caused. A cause of generating a chipping at a side surface of a substrate is considered that stress tends to be applied to the side surface of the substrate when a surface on the side provided with an element layer is fixed with a tape, and a surface on the side not provided with the element layer (substrate) is ground and polished.

In consideration of the above problems, it is an object of the present invention to provide a semiconductor device having a thinned substrate with high yield.

One feature of the present invention is to grind and polish a substrate after forming a protective layer over a predetermined portion of the substrate (at least a side surface of the substrate).

One feature of a manufacturing method of a semiconductor device of the present invention is to form an element layer including a plurality of integrated circuits over one surface of a substrate, and to form a protective layer so as to be in contact with at least a side surface of the substrate. Then, the other surface of the substrate is ground, the ground other surface of the substrate is polished, the protective layer is removed, and the polished substrate and the element layer are divided so as to form stack bodies including a layer provided with at least one of the plurality of integrated circuits.

Another feature of a manufacturing method of a semiconductor device of the present invention is to form an element layer including a plurality of integrated circuits over one surface of a substrate, and to form a protective layer so as to be in contact with at least a side surface of the substrate. Then, the other surface of the substrate is ground, the ground other surface of the substrate is polished, and the polished other surface of the substrate is washed. Subsequently, the washed other surface of the substrate is dried, the protective layer is removed, and the dried substrate and the element layer are divided so as to form stack bodies including a layer provided with at least one of the plurality of integrated circuits.

Another feature of a manufacturing method of a semiconductor device of the present invention is to form an element layer including a plurality of integrated circuits over one surface of a substrate, and to form a protective layer so as to be in contact with the other surface of the substrate and a side surface of the substrate. Then, the other surface of the substrate is ground, the ground other surface of the substrate is polished, the protective layer is removed, and the polished substrate and the element layer are divided so as to form stack bodies including a layer provided with at least one of the plurality of integrated circuits.

One feature in the above-described structure is that one surface or both surfaces of the stack bodies is/are sealed by using a flexible film.

Another feature of a manufacturing method of a semiconductor device of the present invention is to form an element layer including a plurality of integrated circuits over one surface of a substrate, to divide the substrate and the element layer so as to form stack bodies including a layer provided with at least one of the plurality of integrated circuits, and to form a protective layer so as to be in contact with at least side surfaces of the stack bodies. Then, the other surface of the substrate in the stack bodies is ground, the ground other surface of the substrate is polished, and the protective layer is removed.

Another feature of a manufacturing method of a semiconductor device of the present invention is to form an element layer including a plurality of integrated circuits over one surface of a substrate, to divide the substrate and the element layer so as to form stack bodies including a layer provided with at least one of the plurality of integrated circuits, and to form a protective layer so as to be in contact with the other surface of the substrate in the stack bodies and side surfaces of the stack bodies. Then, the other surface of the substrate in the stack bodies is ground, the ground other surface of the substrate is polished, and the protective layer is removed.

One feature in the above-described structure is that the protective layer is formed by a screen printing method, a spin coating method, a droplet discharge method, or a dispensing method. Another feature is that a reversible material is used for the protective layer. In addition, another feature is that hot-melt wax or UV peeling resin is used for the protective layer.

Further, one feature in the above-described structure is that the thickness of the polished substrate is 2 μm or more and 50 μm or less.

The substrate is thinned, for example, by using a physical means, after forming a protective layer over a predetermined portion of the substrate. In more detail, by grinding and polishing the other surface of the substrate, generation of a chip (chipping) at a side surface of the substrate can be suppressed when grinding or polishing the substrate. In addition, by preventing a chipping, generation of a crack or the like can be suppressed. Accordingly, yield of a semiconductor device is improved, and cost of the semiconductor device can be reduced. In addition, by thinning the thickness of the substrate thinner than 100 μm, the substrate obtains flexibility, and a flexible semiconductor device can be manufactured without a method for peeling an element layer from the substrate.

BRIEF DESCRIPTION OF THE DRAWINGS

In the accompanying drawings:

FIGS. 14A and 14B show a manufacturing method of a semiconductor device of the present invention (Embodiment Mode 3);

DETAILED DESCRIPTION OF THE INVENTION

Figure 1:
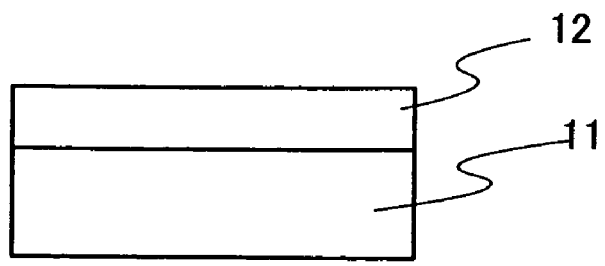
FIG. 1 shows a manufacturing method of a semiconductor device of the present invention (Embodiment Mode 1)

Embodiment modes of the present invention will be described in detail with reference to the drawings. Note that it is easily understood by those skilled in the art that the present invention is not limited to the following descriptions, and various changes may be made in forms and details without departing from the spirit and the scope of the invention. Therefore, the present invention should not be limited to descriptions of the embodiment modes below. The same reference numerals are commonly given to the same components or components having the same function in the structures of the present invention.

In addition, although various conditions such as materials and numeric values are described in this specification, these are just the conditions of materials and numeric values which are aimed to be formed, and it is easily understood by those skilled in the art that some errors in the element composition or property value might be observed in the actually-formed material. In addition, it is also easily understood by those skilled in the art that results themselves which are obtained by measurements using various analyzing methods usually have errors. Accordingly, the present invention should not be limited to descriptions of the embodiment modes below, and conditions which are a little different from the conditions such as materials or numeric values described in this specification are included in the scope of the invention.

Embodiment Mode 1

In Embodiment Mode 1, one structure of a manufacturing method of a semiconductor device of the present invention will be described with reference to the drawings.

First, a layer 12 provided with a plurality of integrated circuits each including an element such as a thin film transistor (hereinafter, referred to as "element layer 12") is formed over one surface of a substrate 11 (FIG. 1). In this specification, "one surface of the substrate 11" means a surface on the side provided with the element layer 12.

The substrate 11 can be a glass substrate, a quartz substrate, a silicon substrate (wafer), a metal substrate, a ceramic substrate, a stainless-steel substrate, a plastic substrate, an acrylic substrate, a substrate in which a surface of a stack body of a glass cloth containing fluorine resin (woven cloth made from glass fibers) or a quartz glass cloth is coated with copper foil, or the like. Preferably, a glass substrate is used. A glass substrate has no big limitation to its dimension and shape. Accordingly, in the case where a glass substrate is used as the substrate 11, a glass substrate having a side of 1 meter or more and having a rectangular shape can be easily used for example, which can dramatically improve productivity. This is a great advantage compared with the case of using a silicon substrate having a circular shape. In addition, from a point of cost of a substrate itself, it is more preferable to use a glass substrate than a quartz substrate, a silicon substrate, a metal substrate, a ceramic substrate, a stainless-steel substrate, or the like. Particularly in the case where a large-sized substrate is required, the cost problem becomes more pronounced. In consideration of mass productivity, a glass substrate is preferably used. In this embodiment mode, a glass substrate is used as the substrate 11.

In the case where a contamination of an impurity or the like from the substrate 11 to the element layer 12 is concerned, a base film is preferably formed between the substrate 11 and the element layer 12. For example, in the case of using a glass substrate as the substrate 11, an alkaline metal such as sodium (Na) contained in the glass substrate can be prevented from entering the element layer 12 by providing the base film.

The base film may have a single-layer structure or a layered structure. In addition, as a material of the base film, a silicon oxide film ($SiO_x$ film), a silicon nitride film ($SiN_x$ film), a silicon oxide film containing nitrogen ($SiO_xN_y$ film) (x>y) (x and y are positive integers), a silicon nitride film containing oxygen ($SiN_xO_y$ film) (x>y) (x and y are positive integers), or the like can be formed by a sputtering method, a plasma CVD (Chemical Vapor Deposition) method, or the like. For example, in the case where the base film has two-layer structure, a silicon nitride film containing oxygen may be used as a first-insulating film, and a silicon oxide film containing nitrogen may be used as a second-insulating film.

The element layer 12 includes a plurality of integrated circuits, and the plurality of integrated circuits is divided from one another to be parts of semiconductor devices (chips). In other words, the later semiconductor devices (chips) include at least a layer provided with at least one of the plurality of integrated circuits. Each of the integrated circuits includes, for example, at least an element typified by a thin film transistor (TFT) or a resistor, and by using such an element, a variety of integrated circuits such as a CPU, a memory, and a microprocessor can be formed. In addition, the element layer 12 can have a structure including an antenna in addition to the element such as a thin film transistor. For example, an integrated circuit formed by using a thin film transistor operates by using alternating voltage generated in an antenna and can perform transmission to a reader/writer by modulating alternating voltage to be applied to the antenna. The antenna may be formed together with a thin film transistor or may be formed separately from a thin film transistor so as to be electrically connected to the thin film transistor later.

In addition, an insulating film may be formed so as to cover the element layer 12, as a protective layer for securing strength of the element layer 12. This insulating film is preferably provided over an entire surface so as to cover the element layer 12; however, it is not necessarily provided over the entire surface and may be provided selectively. As the insulating film, a film containing carbon such as DLC (diamond like carbon), a silicon oxide film containing nitrogen, a silicon nitride film containing oxygen, a film containing an organic material (for example, a resin material such as epoxy) can be used. As a method of forming the insulating film, a sputtering method, various CVD methods such as a plasma CVD method, a spin coating method, a droplet discharge method, a printing method, or the like can be used.

Next, a film 31 is provided so as to cover the element layer 12, and the film 31 is connected to a substrate fixing jig 32. The film 31 serves to fix the substrate when grinding or polishing the substrate, to protect the element layer 12, and to secure gaps between semiconductor devices (chips) when separating the semiconductor devices from the film 31. As a film serving as such roles, an expand film may be used. In addition, a film in which a film for protecting the element layer 12 and an expand film are stacked may be used.

In addition, the film 31 preferably has a strong attachment property in a normal state and has a low attachment property when being irradiated with light. For example, a UV tape, attachment property of which weakens when being irradiated with ultraviolet light, may be used.

Figure 2A:
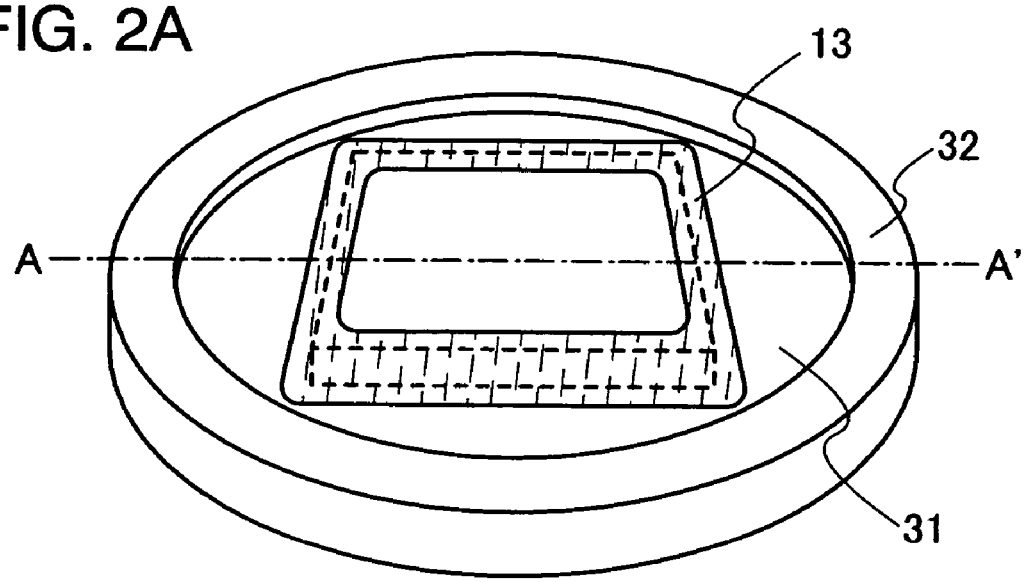
FIGS. 2A and 2B show a manufacturing method of a semiconductor device of the present invention (Embodiment Mode 1)
Figure 2B:
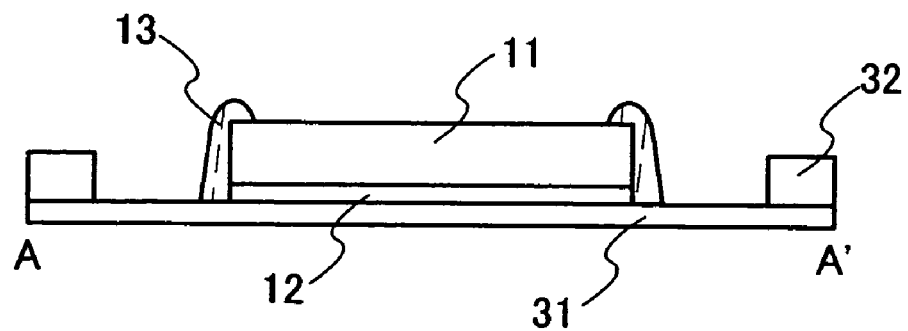

Subsequently, a protective layer 13 is formed as shown in FIGS. 2A and 2B. FIGS. 2A and 2B are a perspective view in the state of forming the protective layer 13 and a sectional view taken along line A-A', respectively. In this embodiment mode, the protective layer 13 is formed to cover a peripheral region of the other surface of the substrate 11 in addition to side surfaces of the substrate 11 and the element layer 12; however, the present invention can be carried out as long as the protective layer 13 is formed to cover at least the side surface (lateral face) of the substrate 11. Accordingly, the protective layer 13 may be formed to entirely cover the other surface of the substrate 11 in addition to the side surfaces of the substrate 11 and the element layer 12. In addition, as shown in FIG. 2B, the protective layer 13 is preferably formed higher than the substrate 11.

As a method of forming the protective layer 13, hand painting, a screen printing method, a spin coating method, a droplet discharge method using an ink jet technique, or a dispensing method can be used. In addition, as a material of the protective layer 13, a material having flexibility can be used. For example, baking may be performed after applying epoxy resin, acrylic resin, or the like, so as to cure the resin. It is preferable to use a material by which the substrate can be peeled easily in a later step, that is, a reversible material. The term "reversible material" in this specification means a material the property of which reversibly changes by the effect of heat or light, and hot-melt wax or UV peeling resin are the examples. In this embodiment mode, a reversible material is used.

In the case of using an irreversible material such as epoxy resin or acrylic resin for the protective layer 13, a region inside a region where the irreversible material is applied is cut, and a region of the element layer 12, which is provided inside, can be used as a semiconductor device.

In addition, in the case where a reversible material is used for the protective layer 13, by softening the reversible material after dry treatment and removing the remained protective layer 13, the element layer 12 can be entirely used as a semiconductor device. In other words, not only a chip such as an RFID tag but also a substrate provided with a pixel of a display device (for example, a panel used in an EL display device or a liquid crystal display device) can be manufactured.

Next, the substrate fixing jig (flame) 32 to which the substrate 11 is attached by the film 31 is provided to an attachment jig 33. At this time, in order not to grind or polish the substrate fixing jig 32 itself, the film 31 is set so that one surface of the substrate 11 (the surface on the side of the film 31) is lower than a surface of the substrate fixing jig 32. The attachment jig 33 is formed of, for example, a porous chuck 34 and a stage 35. In addition, the porous chuck 34 is formed by using a porous material and has a vacuum chuck mechanism.

Figure 3:
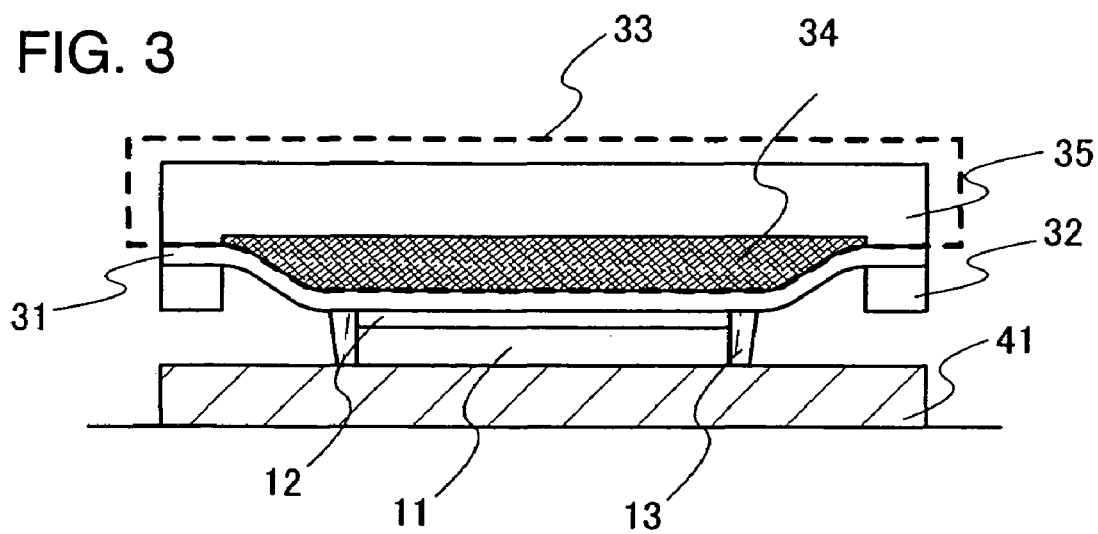
FIG. 3 shows a manufacturing method of a semiconductor device of the present invention (Embodiment Mode 1)

Next, the substrate 11 is thinned, for example, by using a physical means. In more detail, the other surface of the substrate 11 is ground by a grinding means 41 (FIG. 3). At this time, the substrate 11 is preferably ground until the thickness becomes 100 μm or less. When the substrate 11 is ground, the protective layer 13 which is formed on the side surface of the substrate 11 is also ground. In general, in this grinding step, the other surface of the substrate 11 is ground by rotating one or both of the stage 35 to which the substrate 11 is fixed and the grinding means 41. The grinding means 41 corresponds to, for example, a grindstone. In this specification, the term "the other surface of the substrate 11" means a surface opposite to the surface on the side provided with the element layer 12, or the surface on the side which is ground by the grinding means 41. Washing may be conducted if necessary in order to remove a dust generated in the grinding step. In this case, water droplets generated in the washing are removed by drying naturally or by a drying means. Specifically as the drying means, there is a method of rotating the substrate 11, a method of blowing a gas such as air (atmosphere) to the substrate 11 with a blower, or the like.

Figure 4:
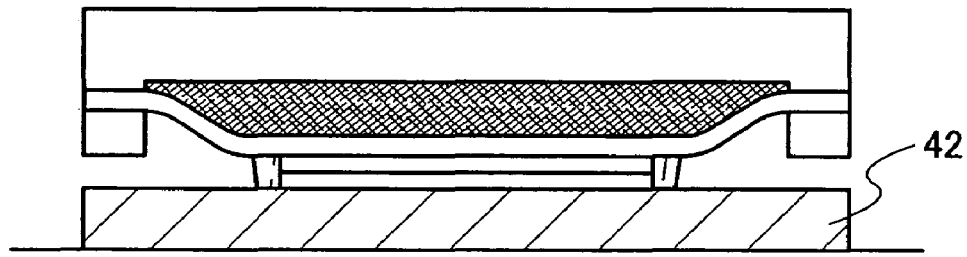
FIG. 4 shows a manufacturing method of a semiconductor device of the present invention (Embodiment Mode 1)

Subsequently, for example, the other surface of the substrate 11, which has been ground, is polished by a polishing means 42 (FIG. 4). When the substrate 11 is polished, the protective layer 13 which is formed on the side surface of the substrate 11 is also polished. The other surface of the substrate 11 is polished until the thickness becomes 100 μm or less, preferably 2 μm or more and 50 μm or less (further preferably, 4 μm or more and 30 μm or less). By thinning (for example, grinding and polishing) the substrate 11 in such a manner, the substrate 11 becomes flexible and a flexible semiconductor device can be manufactured without using a method for peeling the element layer from the substrate 11. This polishing step is carried out, in the same way as the above-described grinding step, by rotating one or both of the stage 35 to which the substrate 11 is fixed and the polishing means 42. The polishing means 42 corresponds to, for example, a polishing pad to which polishing grains are applied. Washing may be conducted if necessary in order to remove a dust generated in the polishing step. In this case, water droplets generated in the washing are removed by drying naturally or by a drying means. Specifically as the drying means, there is a method of rotating the substrate 11, a method of blowing a gas such as air (atmosphere) to the substrate 11 with a blower, or the like.

Figure 5:
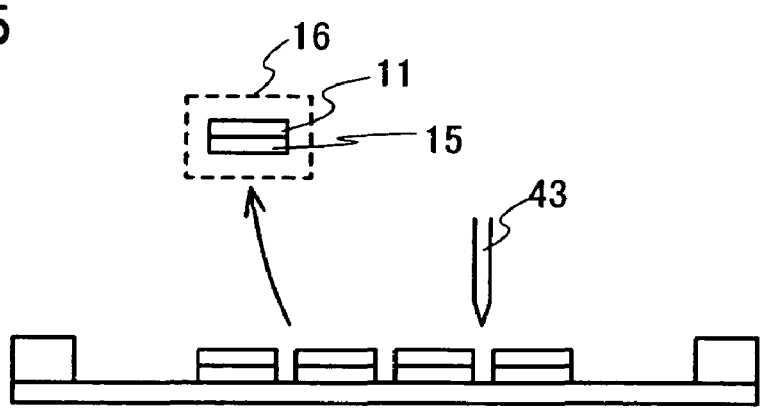
FIG. 5 shows a manufacturing method of a semiconductor device of the present invention (Embodiment Mode 1)

Then, cutting is performed to the substrate 11 and the element layer 12 by a cutting means 43 (FIG. 5). As to the element layer 12, each boundary between integrated circuits (space between integrated circuits) is cut so as to separate the plurality of integrated circuits of the element layer 12 from one another. The elements provided in the element layer 12 are not cut, but the insulating film provided in the element layer 12 is cut. Through this cutting step, a plurality of stack bodies 16 each including the thinned substrate 11 and a layer provided with at least one of the plurality of integrated circuits 15 is formed. The cutting means 43 corresponds to, for example, a dicer, a laser, or a wire saw.

In the case of using a reversible material for the protective layer 13, a reversible reaction is preferably caused to the protective layer 13 before performing the cutting step by the cutting means 43, so as to remove the protective layer 13 from the substrate 11 or to make a state capable of easily peeling the substrate 11 from the protective layer 13. By removing the protective layer 13 in advance before cutting, the peripheral region of the element layer 12, on which the protective layer 13 has been formed, can be used as the layer provided with at least one of the plurality of integrated circuits 15. In this embodiment mode, since a reversible material is used for the protective layer 13 and the protective layer 13 is removed in advance before cutting, the protective layer 13 is not shown in FIG. 5.

Figure 6A:
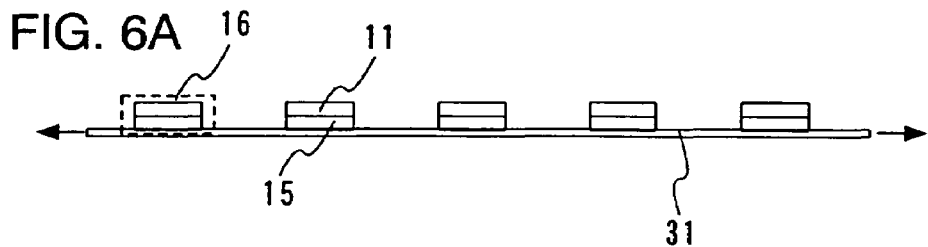
FIGS. 6A to 6D show a manufacturing method of a semiconductor device of the present invention (Embodiment Mode 1)

Next, the film 31 is stretched so as to form a gap between the stack bodies 16 (FIG. 6A). At this time, it is preferable to uniformly stretch the film 31 in plane directions (pull equally to plane directions) so as to make the gap between the stack bodies 16 uniformly. Subsequently, the film 31 is irradiated with light. In the case where the film 31 is a UV tape, the film is irradiated with ultraviolet light. Thus, the attachment property of the film 31 is weakened and the adhesiveness between the film 31 and the stack bodies 16 is lowered by light irradiation. Then, such a state is obtained that the stack bodies 16 can be separated from the film 31 by a physical means.

Note that the term "physical means" in this specification is specifically a dynamic means or a mechanical means having a step applicable to Law of Dynamic, or a means of changing some sort of dynamic energy (mechanical energy). That is, a separation using the physical means is, for example, to perform separation by an external shock (stress) using pressure of a gas emitted from a nozzle, ultrasonic waves, a load using a wedge-shaped member, or the like.

The film 31 is irradiated with light after stretching the film 31 in the above process; however, the present invention is not limited to this order. The film 31 may be stretched after the film 31 is irradiated with light.

Then, sealing treatment is performed to the stack bodies 16 if necessary. The sealing treatment can be carried out with either of the following two kinds of methods. The first method is described below, at first.

Figure 6B:
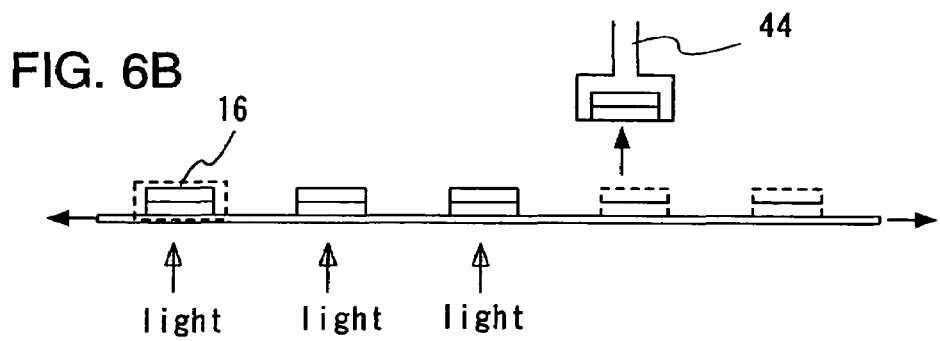

In the first method, the stack bodies 16 are separated from the film 31 by a transfer means 44 (FIG. 6B). Subsequently, the stack bodies 16 are provided over a first base 51 by the transfer means 44 in order to attach one-side surfaces of the stack bodies 16 to the first base 51. Note that the transfer means 44 is specifically a contact transfer means by lifting up using a pin, picking up using an arm, vacuum attachment using a vacuum mechanism, or the like or a contactless transfer means using magnetic force, air pressure, or electrostatic force as attachment power or force for lift, or the like.

Figure 6C:
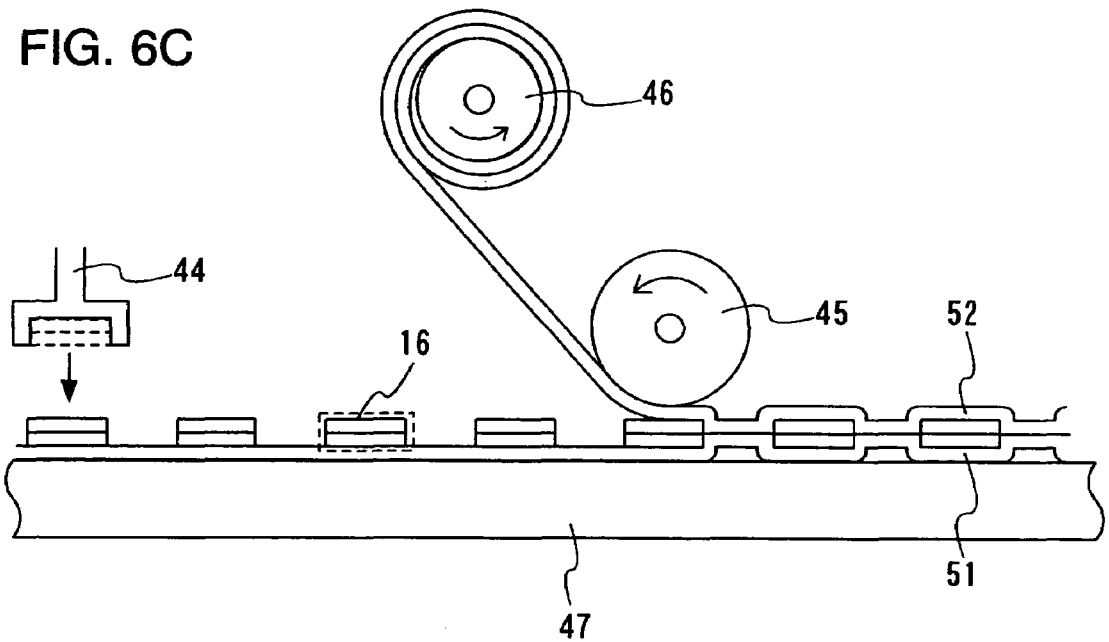

Subsequently, the other-side surfaces of the stack bodies 16 are attached to a second base 52 (FIG. 6C). This step is carried out with a laminator (bonding apparatus), and the laminator includes a supply roll 46 having the second base 52 twined around there and a laminate roll 45 having one or both of a heat means and a pressure means. By sequentially revolving the laminate roll 45 and the supply roll 46, sealing treatment of the stack bodies 16 is continuously performed. Specifically, the other-side surfaces of the stack bodies 16 are attached to the second base 52 with the laminate roll 45, and the stack bodies 16 are sealed with the first base 51 and the second base 52 by conducting one or both of heat treatment and pressure treatment.

As the first base 51 and the second base 52 which are used for sealing, a stack film or the like including an adhesive synthetic resin film (acrylic synthetic resin, epoxy synthetic resin, or the like) and a film which is subjected to antistatic treatment (antistatic film), a film made by using polypropylene, polyester, vinyl, polyvinyl fluoride, vinyl chloride, or the like, paper made of a fibrous material, or a base-material film (polyester, polyamide, an inorganic vapor-deposition film (film to whose surface an inorganic material such as silicon oxide or alumina is vapor-deposited), paper, or the like) can be used. As the film which is subjected to antistatic treatment, a film formed by dispersing an antistatic material in the resin, a film to which an antistatic material is attached, or the like can be given. The film to which the antistatic material is attached may be a film, only one side of which is provided with the antistatic material, or may be a film, both sides of which are provided with the antistatic material. The film in which only one side is provided with the antistatic material may have a structure in which the side provided with the antistatic material is attached so as to be inside of the film or outside of the film. The antistatic material may be formed over an entire surface of the film or a part of the film. As the antistatic material, metal such as aluminum, oxide of indium and tin (ITO), an amphoteric surfactant metal salt, an imidazoline amphoteric surfactant, a resin material containing a cross-linking copolymer having a carboxyl group and a quaternary ammonium base in side chains, or the like can be used. Using the antistatic film as the first base 51 or the second base 52, an adverse effect to the integrated circuits due to external static electricity can be prevented.

The first base 51 and the second base 52 are attached to the stack bodies 16 by thermocompression bond (heat treatment and pressure treatment). In the heat treatment and the pressure treatment, attachment layers provided in the outermost surfaces of the first base 51 and the second base 52 or layers (not attachment layers) provided in the outermost layers of the first base 51 and the second base 52 are melted by the heat treatment, and attachment is conducted by pressure. The attachment layers may be provided over the surfaces of the first base 51 and the second base 52, or the attachment layers are not necessarily provided. The attachment layer corresponds to a layer containing adhesive such as heat-curable resin, ultraviolet curable resin, epoxy resin based adhesive, or resin additive. In addition, after performing sealing treatment, the surfaces of the first base 51 and the second base 52 are preferably subjected to silica coating so as to prevent moisture or the like from entering an inside of the stack bodies 16. Note that in this specification, "silica coating" is to coat a surface of a processing object with powder of silicon dioxide (silica), silicon nitride containing oxygen, silicon oxide containing nitrogen, or the like.

Here, the above laminating treatment is described in more detail. The laminate roll 45 and the supply roll 46 are revolved sequentially, and the supply roll 46 supplies the second base 52 to the laminate roll 45. The first base 51 provided with the plurality of stack bodies 16 is transferred sequentially by a conveyor means 47. The laminating treatment corresponds to the treatment in which one or both of pressure treatment and heat treatment is/are conducted onto the stack bodies 16, the first base 51, and the second base 52 by the laminate roll 45 and the conveyor means 47 when the first base 51 to which the stack bodies 16 are attached passes between the laminate roll 45 and the conveyor means 47. As the laminating treatment is conducted, the stack bodies 16 are sealed with the first base 51 and the second base 52. Note that the conveyor means 47 corresponds to a conveyer belt, a plurality of rollers, robot arms, or the like. When the heat treatment is conducted with the laminate roll 45 and the conveyor means 47, the laminate roll 45 has a heat means corresponding to a heater of a heating wire, oil or the like.

Figure 6D:
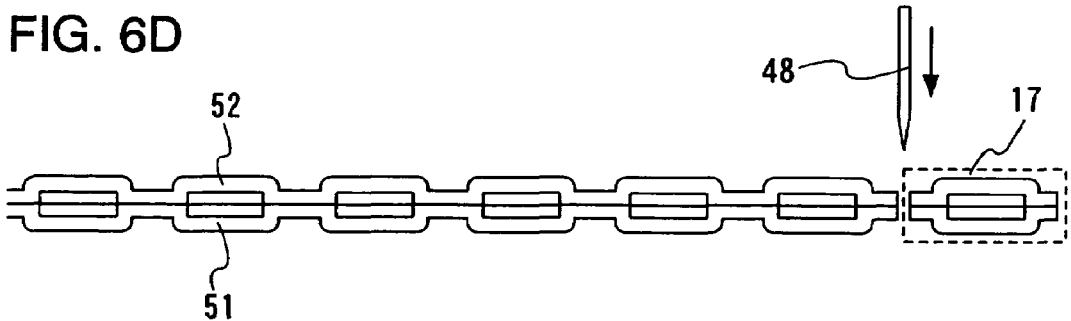

Next, the first base 51 and the second base 52 are cut by a cutting means 48 (FIG. 6D). The cutting means 48 corresponds to a dicer, a laser, a wire saw, or the like. Through the above steps, a semiconductor device (chip) 17 is completed.

Next, the second method will be described.

Figure 7A:
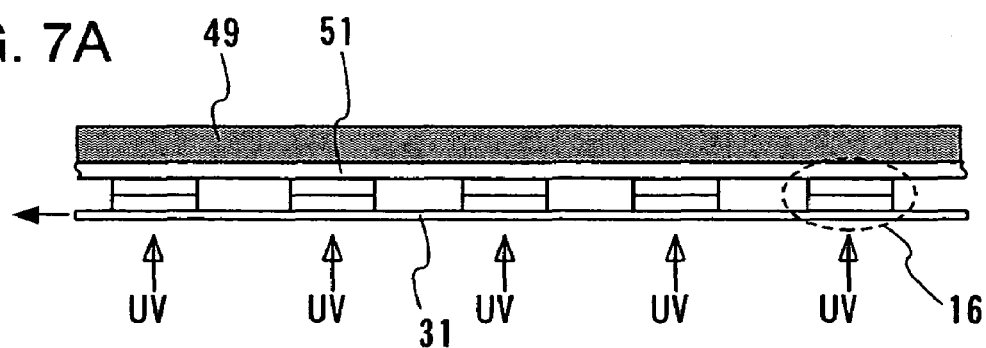
FIGS. 7A and 7B show a manufacturing method of a semiconductor device of the present invention (Embodiment Mode 1)
Figure 7B:
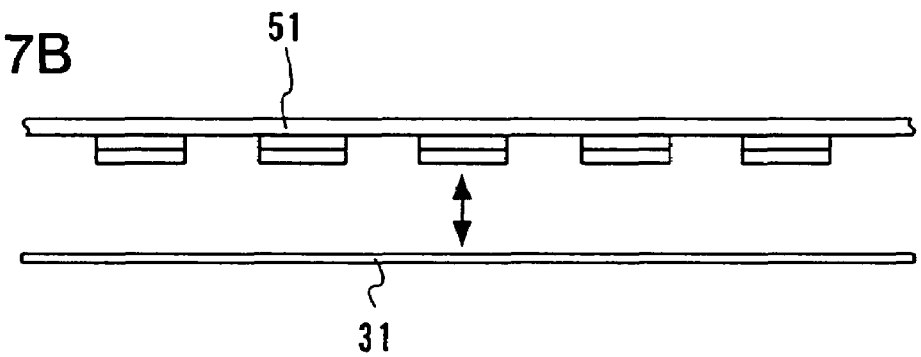

First, the first base 51 is provided so as to cover one-side surfaces of the stack bodies 16 (FIG. 7A). Next, one-side surfaces of the stack bodies 16 are attached to the first base 51 by heating the first base 51 with a heating means 49. Subsequently, the stack bodies 16 are separated from the film 31 (FIG. 7B).

Then, by attaching the other-side surfaces of the stack bodies 16 to the second base 52, the stack bodies 16 are sealed with the first base 51 and the second base 52 (FIG. 6C). Subsequently, the first base 51 and the second base 52 are cut (FIG. 6D). These steps may be carried out in the same way as the first method. Through the process as described above, the semiconductor device (chip) 17 is completed.

Note that the first base 51 is provided so as to cover one-side surfaces of the stack bodies 16 after irradiating the film 31 with light, in the second method (FIG. 7A). However, the present invention is not limited to this order, and in order to decrease adhesiveness between the film 31 and the stack bodies 16, the film 31 may be irradiated with light after providing the first base 51 so as to cover one-side surfaces of the stack bodies 16 and heating the first base 51.

In this embodiment mode, the stack bodies 16 are sealed with two films of the first base 51 and the second base 52. However, the stack bodies 16 may be sealed by using only the first base 51. This is because the substrate 11 of the stack bodies 16 itself serves to prevent entering of moisture or an impurity from outside. Accordingly, a structure in which a surface of the layer provided with the integrated circuit 15 of the stack bodies 16 is covered with the first base 51 may be used.

As for the semiconductor device (chip) 17 completed through the above process, since the substrate is ground and polished after forming the protective layer so as to cover at least the side surface of the substrate, a chipping or crack is hardly generated in the process of grinding and polishing. Accordingly, a semiconductor device having thin thickness of a substrate and lightweight can be manufactured with high yield. In addition, since the thickness of the substrate is thin, the design is not degraded even when the semiconductor device is mounted on an article. The degree of flexibility of the semiconductor device 17 depends on its size or shape. Accordingly, in the case where the semiconductor device 17 with high flexibility is desired to be obtained, the semiconductor device 17 may be manufactured by appropriately designing the size or shape.

Embodiment Mode 2

In Embodiment Mode 2, a manufacturing method of a semiconductor device, which is different from the method explained in Embodiment Mode 1, will be described.

First, an element layer 12 is provided over one surface of a substrate 11. Then, a film 31 is provided to cover the element layer 12, and the film 31 is connected to a substrate fixing jig 32. Since a material, a formation method, and the like of the substrate 11 and the element layer 12 have been described in Embodiment Mode 1, steps thereafter will be described in detail.

Figure 8:
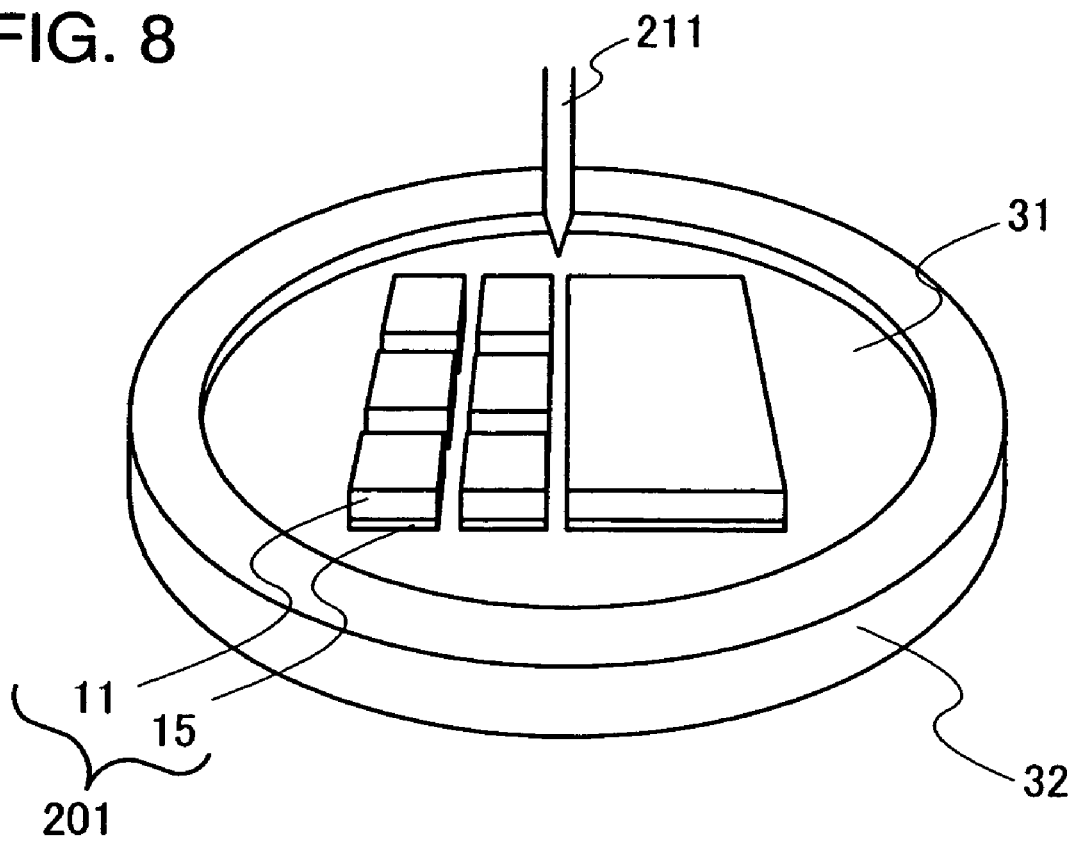
FIG. 8 shows a manufacturing method of a semiconductor device of the present invention (Embodiment Mode 2)

Next, the substrate 11 and the element layer 12 are cut from the other surface of the substrate 11 by a cutting means 211, to form a plurality of stack bodies 201 each including the substrate 11 and a layer provided with at least one integrated circuit 15 (FIG. 8). The cutting means 211 corresponds to, for example, a dicer, a laser, or a wire saw. Note that in the cutting step, the film 31 is not cut.

Figure 9A:
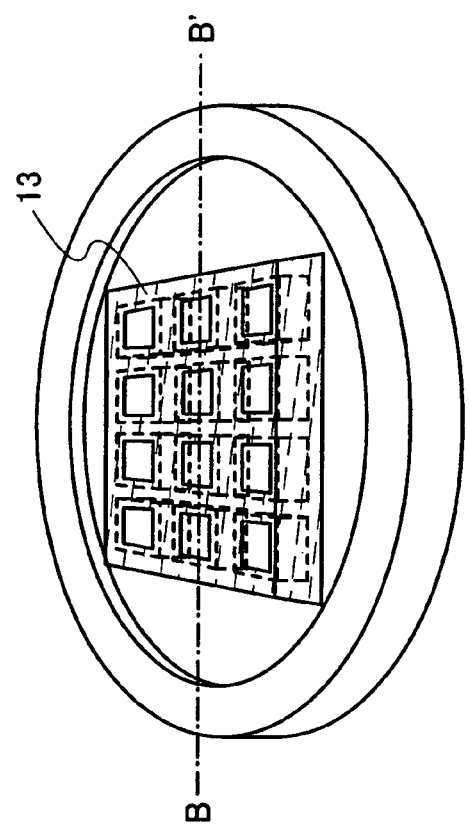
FIGS. 9A and 9B show manufacturing methods of a semiconductor device of the present invention (Embodiment Mode 2)
Figure 9A:
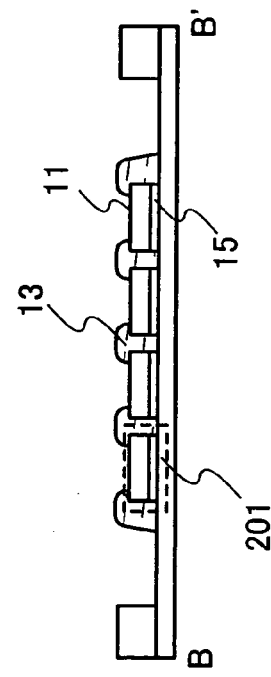
Figure 9B:
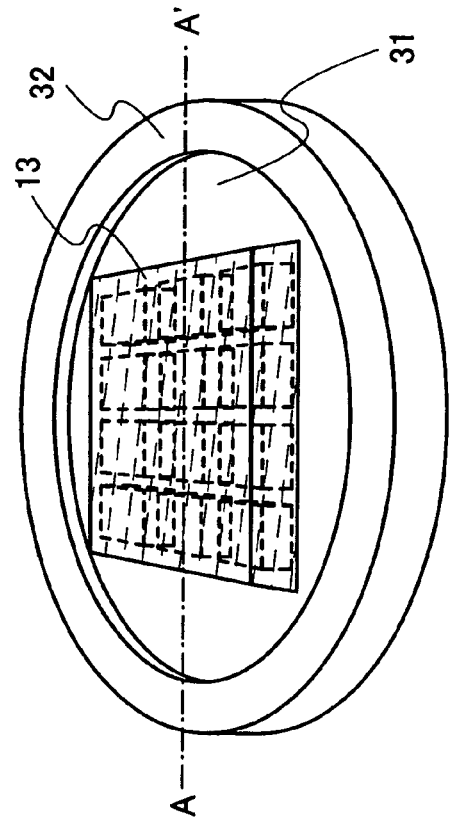
Figure 9B:
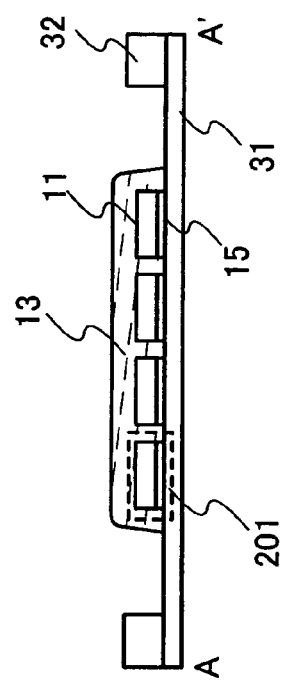

Subsequently, a protective layer 13 is formed so as to cover at least side surfaces of the stack bodies 201. In this embodiment mode, the protective layer 13 is formed so as to entirely cover the other surface of the substrate 11 in addition to the side surfaces of the stack bodies 201 as shown in FIG. 9A; however, the protective layer 13 may be formed so as to partially cover the other surface of the substrate 11 in addition to the side surfaces of the stack bodies 201 as shown in FIG. 9B. FIG. 9A shows a perspective view in a state where the protective layer 13 is formed, and also a sectional view taken along line A-A'. FIG. 9B shows a perspective view in a state where the protective layer 13 is formed, and also a sectional view taken along line B-B'.

As a method of forming the protective layer 13, hand painting, a screen printing method, a spin coating method, a droplet discharge method using an ink jet technique, or a dispensing method can be used. In addition, as a material of the protective layer 13, a material having flexibility can be used. For example, baking may be performed after applying epoxy resin, acrylic resin, or the like, so as to cure the resin. It is preferable to use a material by which the substrate can be peeled easily in a later step, that is, a reversible material. In this embodiment mode, a reversible material is used.

Next, the substrate fixing jig 32 to which the stack bodies 201 are attached by the film 31 is provided to an attachment jig 33. At this time, in order not to grind or polish the substrate fixing jig 32 itself, the film 31 is set so that one surface of the substrate 11 (the surface on the side provided with the film 31) is lower than a surface of the substrate fixing jig 32. The attachment jig 33 is formed of, for example, a porous chuck 34 and a stage 35. In addition, the porous chuck 34 is formed by using a porous material and has a vacuum chuck mechanism.

Figure 10:
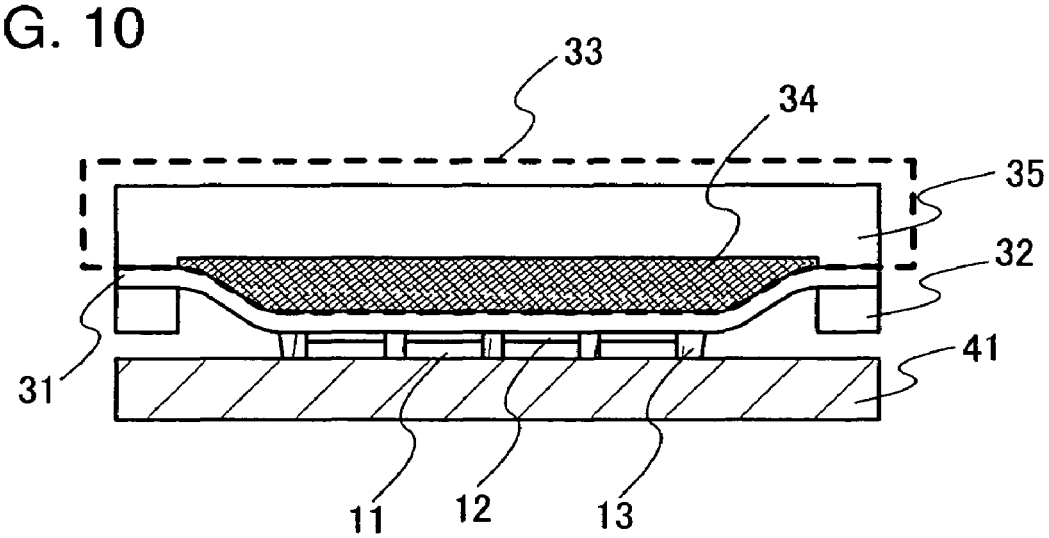
FIG. 10 shows a manufacturing method of a semiconductor device of the present invention (Embodiment Mode 2)

Subsequently, the substrate 11 is thinned, for example, by using a physical means. In more detail, the other surface of the substrate 11 is ground by a grinding means 41 (FIG. 10). In this grinding step, the protective layer 13 is first ground, and then, the other surface of the substrate 11 is ground. In this grinding step, the substrate 11 is preferably ground until the thickness becomes 100 µm or less. In general, in this grinding step, the other surface of the substrate 11 is ground by rotating one or both of the stage 35 to which the substrate 11 is fixed and the grinding means 41. The grinding means 41 corresponds to, for example, a grindstone. Washing may be conducted if necessary in order to remove a dust generated in the grinding step. In this case, water droplets generated in the washing are removed by drying naturally or by a drying means. Specifically as the drying means, there is a method of rotating the substrate 11, a method of blowing a gas such as air (atmosphere) to the substrate 11 with a blower, or the like.

Figure 11:
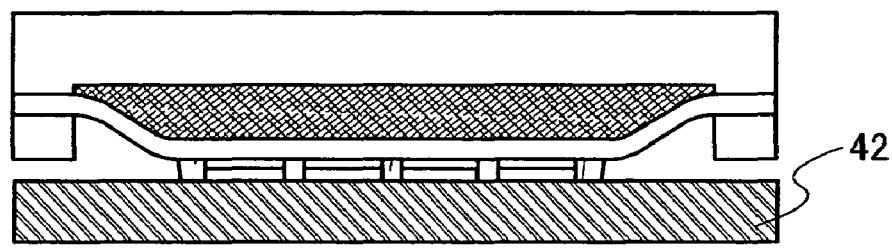
FIG. 11 shows a manufacturing method of a semiconductor device of the present invention (Embodiment Mode 2)

Subsequently, for example, the other surface of the substrate 11, which has been ground, is polished by a polishing means 42 (FIG. 11). In this polishing step, the substrate 11 is polished until the thickness becomes 100 µm or less, preferably 2 µm or more and 50 µm or less (further preferably, 4 µm or more and 30 µm or less). By thinning (for example, grinding and polishing) the substrate 11 in such a manner, the substrate 11 becomes flexible and a flexible semiconductor device can be manufactured without using a method for peeling the element layer from the substrate 11. This polishing step is carried out, in the same way as the above-described grinding step, by rotating one or both of the stage 35 to which the substrate 11 is fixed and the polishing means 42. The polishing means 42 corresponds to, for example, a polishing pad to which polishing grains are applied. Washing may be conducted if necessary in order to remove a dust generated in the polishing step. In this case, water droplets generated in the washing are removed by drying naturally or by a drying means. Specifically as the drying means, there is a method of rotating the substrate 11, a method of blowing a gas such as air (atmosphere) to the substrate 11 with a blower, or the like.

Figure 12:
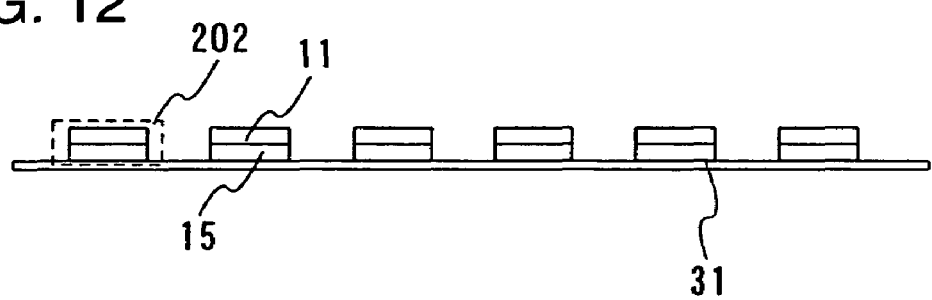
FIG. 12 shows a manufacturing method of a semiconductor device of the present invention (Embodiment Mode 2)

Next, a reversible reaction is caused to the protective layer 13 so as to remove the remained part of the protective layer 13. Instead of removing the remained part of the protective layer 13, a state may be made, in which the stack bodies 201 can be easily peeled from the protective layer 13. Through the above process, stack bodies 202 including the thinned substrate 11 can be obtained (FIG. 12).

Subsequently, the stack bodies 202 including the thinned substrate 11 are subjected to sealing treatment using a base (film) if necessary. Through the above process, a semiconductor device (chip) 17 is completed. The explanation of the sealing treatment is herein omitted since the description in Embodiment Mode 1 can be applied.

As for the semiconductor device (chip) 17 completed through the above process, since the substrate is ground and polished after forming the protective layer so as to cover at least the side surfaces of the stack bodies, a chipping or crack is hardly generated in the process of grinding and polishing. Accordingly, a semiconductor device having thin thickness of a substrate and lightweight can be manufactured with high yield. In addition, since the thickness of the substrate is thin, the design is not degraded even when the semiconductor device is mounted on an article. The degree of flexibility of the semiconductor device 17 depends on its size or shape. Accordingly, in the case where the semiconductor device 17 with high flexibility is desired to be obtained, the semiconductor device 17 may be manufactured by appropriately designing the size or shape.

This embodiment mode can be implemented by freely combining with the above-described embodiment mode. In other words, the material and the formation method described in the above embodiment mode can be used in this embodiment mode, and the material and the formation method described in this embodiment mode can also be used in the above-described embodiment mode.

Embodiment Mode 3

In Embodiment Mode 3, a manufacturing method of a semiconductor device of the present invention including a thin film transistor and an antenna will be described with reference to the drawings. In particular, a structure of an element layer will be described in detail.

Figure 13A:
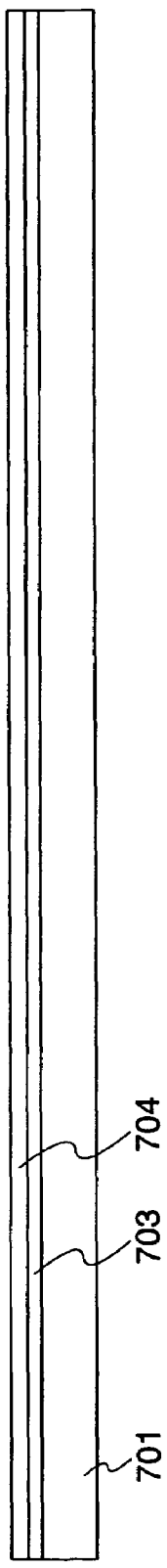
FIGS. 13A to 13C show a manufacturing method of a semiconductor device of the present invention (Embodiment Mode 3)

First, a base film 703 is formed over a substrate 701 (FIG. 13A). The explanation about a material and a formation method of the substrate 701 and the base film 703 is herein omitted since the material and the formation method described in Embodiment Mode 1 can be used. A process of forming an element layer over the base film 703 is hereinafter described.

Figure 13B:
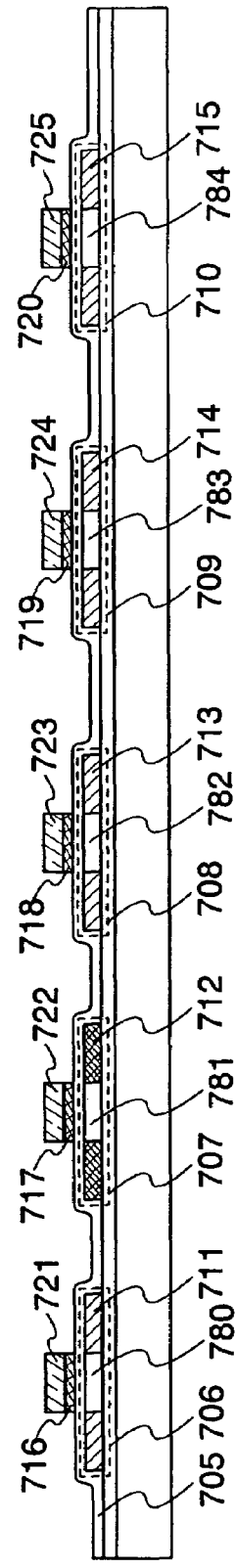

First, an amorphous semiconductor film (for example, a film mainly containing amorphous silicon) 704 is formed over the base film 703. The amorphous semiconductor film 704 is formed to have a thickness of 25 to 200 nm (preferably, 30 to 150 nm) by a sputtering method or various CVD methods such as a plasma CVD method. Subsequently, the amorphous semiconductor film 704 is crystallized to form a crystalline semiconductor film. As a crystallization method, a laser crystallization method, a thermal crystallization method using RTA or an annealing furnace, a thermal crystallization method using a metal element for promoting crystallization, a method in which a thermal crystallization method using a metal element for promoting crystallization is combined with a laser crystallization method, or the like can be used. Thereafter, the thus obtained crystalline semiconductor film is etched into a desired shape to form crystalline semiconductor films 706 to 710 (FIG. 13B). Note that the base film 703 and the amorphous semiconductor film 704 can be continuously formed without being exposed to air An example of manufacturing steps of the crystalline semiconductor films 706 to 710 is briefly described below. As a method for crystallizing the amorphous semiconductor film, a laser crystallization method, a thermal crystallization method using RTA or an annealing furnace, a thermal crystallization method using a metal element for promoting crystallization, a method in which a thermal crystallization method using a metal element for promoting crystallization is combined with a laser crystallization, or the like can be given. Further, as another crystallization method, crystallization may be performed by generating thermal plasma by applying DC bias and making the thermal plasma affect a semiconductor film.

In this embodiment mode, an amorphous semiconductor film with a thickness of 40 to 300 nm is formed by a plasma CVD method, and then the amorphous semiconductor film is crystallized by heat treatment to form the crystalline semiconductor films 706 to 710. As the heat treatment, a laser heating furnace, laser irradiation, irradiation of light emitted from a lamp instead of a laser beam (hereinafter, referred to as lamp annealing), or a combination thereof can be used.

In the case of laser irradiation, a continuous wave oscillation laser beam (a CW laser beam) or a pulsed oscillation laser beam (a pulsed laser beam) can be used. As a laser beam that can be used here, a laser beam emitted from one or more kinds of a gas laser such as an Ar laser, a Kr laser, or an excimer laser; a laser using, as a medium, a single crystal of YAG, $YVO_4$, forsterite ($Mg_2SiO_4$), $YAlO_3$, or $GdVO_4$ or a polycrystal (ceramic) of YAG, $Y_2O_3$, $YVO_4$, $YAlO_3$, or $GdVO_4$ doped with one or more kinds of Nd, Yb, Cr, Ti, Ho, Er, Tm, and Ta as a dopant; a glass laser; a ruby laser; an alexandrite laser; a Ti:sapphire laser; a copper vapor laser or a gold vapor laser can be used. Irradiation with the fundamental waves of such a laser beam or the second harmonic to fourth harmonic laser beam of these fundamental waves allows large crystals in grain size to be obtained. For example, the second harmonic (532 nm) and the third harmonic (355 nm) of Nd:YVO$_4$ laser (fundamental wave: 1064 nm) can be used. The energy density of the laser in this case needs to be approximately 0.01 to 100 MW/cm$^2$ (preferably 0.1 to 10 MW/cm$^2$). Then, irradiation is carried out at a scanning rate of approximately 10 to 2000 cm/sec.

Further, a laser using, as a medium, a single crystal of YAG, YVO$_4$, forsterite (Mg$_2$SiO$_4$), YAlO$_3$, or GdVO$_4$ or a polycrystal (ceramic) of YAG, Y$_2$O$_3$, YVO$_4$, YAlO$_3$, or GdVO$_4$ doped with one or more kinds of Nd, Yb, Cr, Ti, Ho, Er, Tm and Ta as a dopant; an Ar ion laser or a Ti:sapphire laser can perform continuous wave oscillation. Also, pulsed oscillation at a repetition rate of 10 MHz or more is possible by carrying out Q-switch operation, mode locking, or the like. When pulsed oscillation at a repetition rate of 10 MHz or more is carried out, the semiconductor film is irradiated with the next pulse after melting of the semiconductor film by laser and before solidification thereof. Accordingly, in contrast to a case of using a pulsed laser at a lower repetition rate, the solid-liquid interface in the semiconductor film can be continuously moved, and a crystal grain grown continuously toward the scanning direction can be thus obtained.

In the case of performing crystallization with the use of a continuous wave laser or a laser beam which oscillates at a repetition rate of 10 MHz or more as described above, a surface of the crystallized semiconductor film can be planarized. As a result, a gate insulating film 705, which is to be formed later, can be formed thinly. In addition, this contributes to improve pressure resistance of the gate insulating film.

The use of ceramic (polycrystal) as the medium allows the medium to be formed in a free shape at low cost in a short time. Although a columnar medium of several millimeters in diameter and several tens of millimeters in length is typically used in the case of using a single crystal, larger mediums can be formed in the case of using ceramic.

Since the concentration of the dopant such as Nd or Yb in the medium, which directly contributes to light emission, is not able to be changed significantly, improvement in laser power by increasing the concentration of the dopant has a certain level of limitation. However, in the case of ceramic, drastic improvement in power can be expected since the size of the medium can be significantly larger, compared with the size of single crystals.

In addition, in the case of using ceramic as a medium, a medium having a shape of a parallelepiped or a rectangular parallelepiped can be formed easily. By using a medium having such a shape and zigzagging oscillation light in the medium, oscillating light path can be lengthened. Accordingly, amplification is increased and oscillation with high output power can be performed. Since a laser beam emitted from the medium having such a shape has a cross section of a quadrangular shape when being emitted, formation into a linear beam is easier than in the case of using a circular beam. The laser beam emitted in such a manner is changed in shape by using an optical system; accordingly, a linear beam having a short side of 1 mm or less and a long side of several millimeters to several meters can be obtained easily. In addition, by uniformly irradiating the medium with exciting light, a linear beam has a uniform energy distribution in long side direction.

By irradiating a semiconductor film with this linear beam, the semiconductor film can be annealed uniformly. In the case where a linear beam that is uniform across its width needs to be irradiated, both sides of the beam are provided with slits so as to intercept light of a portion where energy of the linear beam is attenuated.

When the obtained uniform intensity linear beam is used to anneal the semiconductor film and this semiconductor film is used to manufacture a semiconductor device, the semiconductor device can have favorable and uniform characteristics.

Next, the gate insulating film 705 is formed to cover the crystalline semiconductor films 706 to 710. The gate insulating film 705 may be formed by a sputtering method or various CVD methods such as a plasma CVD method. Specifically, a silicon oxide film (SiO$_x$ film), a silicon nitride film (SiN$_x$ film), a silicon oxide film containing nitrogen (SiO$_x$N$_y$ film) (x>y) (x and y are positive integers), or a silicon nitride film containing oxygen (SiN$_x$O$_y$ film) (x>y) (x and y are positive integers) is formed as a single-layer structure, or any of the films described above are appropriately stacked. By performing high-density plasma treatment in an atmosphere containing oxygen, nitrogen, or oxygen and nitrogen to the crystalline semiconductor films 706 to 710, surfaces of the crystalline semiconductor films 706 to 710 may be oxidized or nitrided to form gate insulating films. By the high-density plasma treatment, the gate insulating films which are dense and has the thickness, film quality, and the like which are more uniform than those of a film formed by a CVD method, a sputtering method, or the like, can be formed.

In this specification, the term "high-density plasma treatment" is characterized in that the electron density of plasma is $1 \times 10^{11}$ cm$^{-3}$ or more and $1 \times 10^{13}$ cm$^{-3}$ or less and the electron temperature of plasma is 0.5 eV or more and 1.5 eV or less. When the description of "high-density plasma treatment" appears alone in this specification, the description means the plasma treatment under the above-described conditions. Although the electron density of plasma is high, plasma damages to the substrate can be prevented. This is because the electron temperature around a processing object (metal film) formed over the substrate is low. In addition, since the electron density of plasma is as high as $1 \times 10^{11}$ cm$^{-3}$ or more, the oxide (or the nitride) formed by oxidation (or nitridation) treatment is superior in evenness of film thickness and it is also possible to form a dense film. In addition, since the electron temperature of plasma is as low as 1.5 eV or less, the oxidation treatment (or nitridation treatment) can be performed at a lower temperature than in the case of plasma treatment or a thermal oxidation method. For example, the plasma oxidation treatment (or plasma nitridation treatment) can be performed sufficiently even when the plasma treatment is performed at a temperature 100° C. or more lower than a strain point of a glass substrate (typically, a temperature of 250 to 550° C.). As a power source frequency for generating plasma, a microwave 2.45 GHz) is used. In addition, potential of plasma is as low as 5 V or less; thus, excessive dissociation of raw material molecules can be suppressed.

As the atmosphere containing oxygen, a mixed gas of a rare gas and oxygen (O$_2$), nitrogen dioxide (NO$_2$), or dinitrogen monoxide (N$_2$O); or a mixed gas of a rare gas, hydrogen (H$_2$), and oxygen (O$_2$), nitrogen dioxide (NO$_2$), or dinitrogen monoxide (N$_2$O) can be used. As the rare gas, there is argon (Ar), xenon (Xe), or krypton (Kr). The flow ratio (or pressure ratio) of the gases in the mixed gas may be appropriately determined. As an example of the combination of the mixed gas, a combination of oxygen (or nitrogen dioxide or dinitrogen monoxide) of 0.1 to 100 sccm and argon of 100 to 5000 sccm may be used. In addition, as another example of the combination of the mixed gas, a combination of oxygen (or nitrogen dioxide or dinitrogen monoxide) of 0.1 to 100 sccm, hydrogen of 0.1 to 100 sccm, and argon of 100 to 5000 sccm may be used, and it is preferable that the mixed gas be introduced with a ratio of oxygen (or nitrogen dioxide or dinitrogen monoxide):hydrogen:argon of 1:1:100. For example, a mixed gas of oxygen (or nitrogen dioxide or dinitrogen monoxide) of 5 sccm, hydrogen of 5 sccm, and argon of 500 sccm may be introduced. By introducing hydrogen into the mixed gas, treatment time for oxidation can be shortened.

As the atmosphere containing nitrogen, a mixed gas of a rare gas and nitrogen ($N_2$) or ammonia ($NH_3$); or a mixed gas of a rare gas, hydrogen ($H_2$), and nitrogen ($N_2$) or ammonia ($NH_3$) can be used. As an example of the combination of the mixed gas, a combination of nitrogen (or ammonia) of 20 to 2000 sccm and argon of 100 to 10000 sccm can be used. In addition, as another example of the combination of the mixed gas, nitrogen (or ammonia) of 20 to 2000 sccm, hydrogen of 1 to 500 sccm, and argon of 100 to 10000 sccm may be used, and it is preferable that the mixed gas be introduced with a ratio of nitrogen (or ammonia):hydrogen:argon of 20:1:100. For example, a mixed gas of nitrogen (or ammonia) of 100 sccm, hydrogen of 5 sccm, and argon of 500 sccm may be introduced. By introducing hydrogen into the mixed gas, treatment time for nitridation can be shortened.

As the atmosphere containing oxygen and nitrogen, a mixed gas of $O_2$, a rare gas, and $N_2$ or $NH_3$ can be used. As an example of the combination of the mixed gas, a combination of nitrogen (or ammonia) of 20 to 1000 sccm, oxygen of 10 to 500 sccm, and argon of 100 to 5000 sccm can be used, and it is preferable that the mixed gas be introduced with a ratio of nitrogen (or ammonia):oxygen:argon of 2:1:10.

When the gate insulating film 705 is formed by the high-density plasma treatment, an insulating film with a thickness of 1 to 20 nm, and typically, 5 to 10 nm, is formed over the crystalline semiconductor films 706 to 710. A reaction in this case is a solid-phase reaction; therefore, interface state density between the insulating film and the crystalline semiconductor films 706 to 710 can be extremely reduced. Further, since the crystalline semiconductor films 706 to 710 are directly oxidized or nitrided, variations in the thickness of the formed gate insulating film 705 can be suppressed significantly and ideally. Furthermore, since strong oxidation does not occur in a crystal grain boundary of crystalline silicon, an extremely preferable state is made. That is, solid-phase oxidation of each surface of the crystalline semiconductor films by the high-density plasma treatment shown here allows an insulating film with low interface state density and good uniformity to be formed without generating an abnormal oxidation reaction in a crystal grain boundary.

Note that, as the gate insulating film 705, only an insulating film formed by the high-density plasma treatment may be used. Alternatively, the insulating film formed through the high-density plasma treatment and another insulating film containing silicon oxide, silicon nitride containing oxygen, or silicon oxide containing nitrogen may be stacked by a CVD method utilizing plasma or a thermal reaction to form the gate insulating film 705. In either case, when a transistor is formed to have a gate insulating film which partly or entirely includes the insulating film formed by high-density plasma, variations in characteristics can be reduced.

Further, the crystalline semiconductor films 706 to 710 formed by crystallizing the amorphous semiconductor film 704 by irradiation of a continuous wave laser beam or a laser beam which oscillates at a repetition rate of 10 MHz or more while scanning the amorphous semiconductor film 704 with the laser beam in one direction, have a characteristic that crystals grow in a scanning direction of the laser beam. Therefore, when a transistor is disposed such that the scanning direction corresponds to a channel length direction (a direction in which carries flow when a channel forming region is formed) and the gate insulating film 705 formed by the high-density plasma treatment is used, a transistor with less variations in characteristics and high electron field-effect mobility can be obtained.

Subsequently, a first conductive film and a second conductive film are stacked over the gate insulating film 705. The first conductive film and the second conductive film may be formed by a sputtering method or various CVD methods such as a plasma CVD method. In this embodiment mode, the first conductive film is formed to have a thickness of 20 to 100 nm, and the second conductive film is formed to have a thickness of 100 to 400 nm. The first conductive film and the second conductive film can be formed by using an element selected from tantalum (Ta), tungsten (W), titanium (Ti), molybdenum (Mo), aluminum (Al), copper (Cu), chromium (Cr), niobium (Nb), or the like, or an alloy material or a compound material containing these elements as its main component. Alternatively, a semiconductor material typified by polycrystalline silicon doped with an impurity element such as phosphorus may be used. As an example of the combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, or the like can be given. Since tungsten or tantalum nitride has high heat resistance, heat treatment can be performed in order to perform thermal activation after the first conductive film and the second conductive film are formed. In addition, a single-layer structure or a three-layer structure may be employed instead of the two-layer structure of the first conductive film and the second conductive film. In the case of employing the single-layer structure or the three-layer structure, a similar material to that of the first conductive film or the second conductive film described above can be freely selected as a material of a conductive film.

Next, a resist mask is formed by a photolithography method and etching treatment for forming a gate electrode and a gate line is performed to form conductive films (hereinafter, also referred to as gate electrodes in this specification) 716 to 725 serving as gate electrodes.

Then, a resist mask is newly formed by a photolithography method. Thereafter, an impurity element imparting N-type conductivity is added into the crystalline semiconductor films 706 and 708 to 710 at a low concentration by an ion doping method or an ion implantation method. Thus, N-type impurity regions 711 and 713 to 715 and channel forming regions 780 and 782 to 784 are formed. An element belonging to group 15 may be used as the impurity element imparting N-type conductivity and, for example, phosphorus (P) or arsenic (As) is used.

Subsequently, a resist mask is formed by a photolithography method. Thereafter, an impurity element imparting P-type conductivity is added into the crystalline semiconductor film 707 to form a P-type impurity region 712 and a channel forming region 781. For example, boron (B) is used as the impurity element imparting P-type conductivity. Note that, as for the order of forming the N-type impurity regions 711 and 713 to 715 and the P-type impurity region 712, the P-type impurity region 712 may be formed after forming the N-type impurity regions 711 and 713 to 715 as described in this embodiment mode, or the N-type impurity regions 711 and 713 to 715 may be formed after forming the P-type impurity region 712.

Figure 13C:
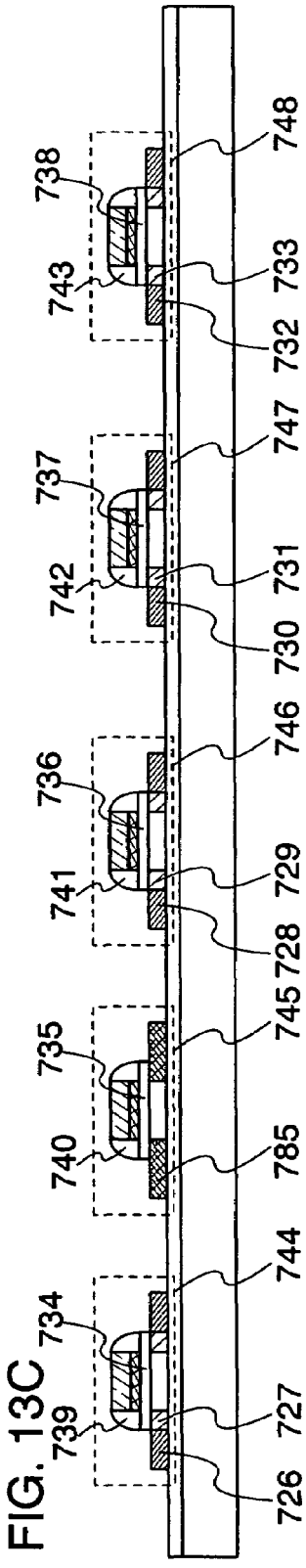

Next, an insulating film is formed so as to cover the gate insulating film 705 and the conductive films 716 to 725. The insulating film is formed by a single layer or a stacked layer of a film made of an inorganic material such as silicon, oxide of silicon, or nitride of silicon, or a film made of an organic material such as an organic resin by a sputtering method or various CVD methods such as a plasma CVD method. Then, the insulating film is selectively etched by anisotropic etching which mainly etch in the vertical direction, to form insulating films (also referred to as sidewalls) 739 to 743 in contact with side surfaces of the conductive films 716 to 725 (FIG. 13C). Concurrently with manufacturing the insulating films 739 to 743, insulating films 734 to 738 are formed by etching the gate insulating film 705. The insulating films 739 to 743 are used as masks for doping when forming an LDD (Lightly Doped Drain) region subsequently.

Then, a resist mask is formed by a photolithography method. Using the resist mask and the insulating films 739 to 743 as masks, an impurity element imparting N-type conductivity is added into the crystalline semiconductor films 706 and 708 to 710 so that first N-type impurity regions (also referred to as LDD regions) 727, 729, 731 and 733 and second N-type impurity regions 726, 728, 730 and 732 are formed. The concentration of the impurity element in the first N-type impurity regions 727, 729, 731 and 733 is lower than the concentration of the impurity element in the second N-type impurity regions 726, 728, 730 and 732. Through the above-described steps, N-type thin film transistors 744 and 746 to 748 and a P-type thin film transistor 745 are completed.

There are the following two methods for forming the LDD region. In one method, a gate electrode with a layered structure having two or more layers is formed, etching in which a tapered shape is formed in the gate electrode or anisotropic etching is performed, and a conductive film of the lower layer included in the gate electrode is used as a mask. In the other method, a sidewall insulating film is used as a mask. A thin film transistor that is formed by the former method has a structure in which an LDD region is overlapped with a gate electrode with a gate insulating film interposed therebetween. However, in this structure, which utilizes etching in which a tapered shape is formed in the gate electrode or anisotropic etching, it is difficult to control the width of the LDD region, and the LDD region may not be formed if the etching step is not performed preferably. On the other hand, the latter method which uses a sidewall insulating film as a mask is, as compared to the former method, easier to control the width of the LDD region and can form the LDD region certainly. Note that the term "etching in which a tapered shape is formed in the gate electrode" means to perform etching so as to form a side surface of the gate electrode into a tapered shape.

Subsequently, after removing a natural oxide film formed over a surface of the exposed N-type impurity regions 726, 728, 730 and 732 and the P-type impurity region 785, a silicide region may be formed appropriately using a metal film. As the metal film, a nickel film, a titanium film, a cobalt film, a platinum film, a film made of an alloy containing at least two kinds of these elements, or the like can be used. More specifically, for example, a nickel film is used as the metal film and the silicide region is formed by heat treatment after forming the nickel film at a room temperature with a deposition power of 500 W to 1 kW by a sputtering method. As the heat treatment, RTA, furnace annealing, or the like can be used. At this time, by controlling the film thickness of the metal film, the heating temperature, and the heating time, it is possible to have the silicide region only on surfaces of the N-type impurity regions 726, 728, 730 and 732 and the P-type impurity region 785, or the silicide region can be entirely formed in the N-type impurity regions 726, 728, 730 and 732 and the P-type impurity region 785 as well. Lastly, nickel which has not reacted is removed. For example, nickel which has not reacted is removed by using an etching solution composed of $HCl:HNO_3:H_2O=3:2:1$.

Note that this embodiment mode shows an example in which the thin film transistors 744 to 748 are of a top-gate type; however, it is obvious that each of the thin film transistors may be a bottom-gate thin film transistor. Further, a single gate structure, in which a single channel forming region is formed in each of the thin film transistors 744 to 748, is described in this embodiment mode. Alternatively, a double-gate structure in which two channel forming regions are formed in each of the thin film transistors or a triple-gate structure in which three channel forming regions are formed in each of the thin film transistors may be employed. Moreover, a dual gate structure having two gate electrodes which are disposed over and below a channel forming region with a gate insulating film interposed therebetween, or other structure may be employed.

In addition, the thin film transistors 744 to 748 may each have a structure other than the structure described in this embodiment mode, and for example, may have an impurity region (including a source region, a drain region, and an LDD region), a p-channel TFT, an n-channel TFT, or a CMOS circuit. Further, an insulating film (sidewall) may be formed so as to be in contact with a side surface of a gate electrode formed over or below a semiconductor film.

Through the above process, after completing the N-type thin film transistors 744 and 746 to 748 and the P-type thin film transistor 745, heat treatment may be performed in order to recover the crystallinity of the crystalline semiconductor films 706 to 710 or activate the impurity element which has been added into the crystalline semiconductor films 706 to 710. In addition, preferably, after performing the heat treatment, hydrogen may be made to be contained in a surface of the exposed gate insulating film 705 by performing high-density plasma treatment to the gate insulating film 705 in an atmosphere containing hydrogen. This is because this hydrogen can be utilized in performing a subsequent step of hydrogenating the crystalline semiconductor films 706 to 710. Alternatively, the crystalline semiconductor films 706 to 710 can be hydrogenated by performing high-density plasma treatment in an atmosphere containing hydrogen while heating the substrate at a temperature of 350 to 450° C. Note that as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 705 can be nitrided as well as hydrogenated.

Next, an insulating film is formed in a single layer or a stacked layer so as to cover the thin film transistors 744 to 748 (FIG. 14A). The insulating film that covers the thin film transistors 744 to 748 is formed by a single layer or a stacked layer using an inorganic material such as oxide of silicon or nitride of silicon, an organic material such as polyimide, polyamide, benzocyclobutene, acrylic, epoxy, or siloxane, or the like by an SOG (Spin On Glass) method, a droplet discharge method, or the like. In this specification, siloxane has a skeletal structure formed by the bond of silicon (Si) and oxygen (O), in which an organic group containing at least hydrogen (for example, an alkyl group or aromatic hydrocarbon) is used as a substituent. Alternatively, a fluoro group, or an organic group containing at least hydrogen and a fluoro group may be used as the substituent. For example, in a case where the insulating film that covers the thin film transistors 744 to 748 has a three-layer structure, a film containing silicon oxide as its main component may be formed as an insulating film 749 in the first layer, a film containing resin as its main component may be formed as an insulating film 750 in the second layer, and a film containing silicon nitride as its main component may be formed as an insulating film 751 in the third layer. In addition, in a case where the insulating film that covers the thin film transistors 744 to 748 has a single-layer structure, a silicon nitride film or a silicon nitride film containing oxygen may be formed. At this time, preferably, hydrogen may be made to be contained in a surface of the silicon nitride film or the silicon nitride film containing oxygen by performing high-density plasma treatment to the silicon nitride film or the silicon nitride film containing oxygen in an atmosphere containing hydrogen. This is because this hydrogen can be utilized in performing a subsequent step of hydrogenating the crystalline semiconductor films 706 to 710. Alternatively, the crystalline semiconductor films 706 to 710 can be hydrogenated by performing high-density plasma treatment in an atmosphere containing hydrogen while heating the substrate at a temperature of 350 to 450° C. Note that as the atmosphere containing hydrogen, a mixed gas of hydrogen ($H_2$) or ammonia ($NH_3$) and a rare gas (for example, argon (Ar)) can be used. When the mixed gas of ammonia ($NH_3$) and a rare gas (for example, argon (Ar)) is used as the atmosphere containing hydrogen, the surface of the gate insulating film 705 can be nitrided as well as hydrogenated.

Before forming the insulating films 749 to 751 or after forming one or a plurality of thin films among the insulating films 749 to 751, heat treatment is preferably performed in order to recover the crystallinity of the crystalline semiconductor films 706 to 710, activate the impurity element which has been added into the crystalline semiconductor films 706 to 710, or hydrogenate the crystalline semiconductor films 706 to 710. As for the heat treatment, a thermal annealing method, a laser annealing method, an RTA method, or the like is preferably adopted. For example, in order to activate the impurity element, thermal annealing at 500° C. or more may be performed. In addition, in order to hydrogenate the crystalline semiconductor films 706 to 710, thermal annealing at a temperature of 350 to 450° C. may be performed.

Then, the insulating films 749 to 751 are etched by a photolithography method to form contact holes which expose the N-type impurity regions 726, 728, 730 and 732 and the P-type impurity region 785. Subsequently, a conductive film is formed so as to fill the contact holes, and the conductive film is patterned to form conductive films 752 to 761 each of which functions as a source or drain wire.

The conductive films 752 to 761 are formed using a conductive film containing aluminum (Al) as its main component by a sputtering method or various CVD methods such as a plasma CVD method. The conductive film containing aluminum (Al) as its main component corresponds to a material containing aluminum as its main component and nickel, or an alloy material containing aluminum as its main component, nickel, and one or both of carbon and silicon, for example. A conductive film containing aluminum as its main component generally has difficulty in heat resistance; therefore, it is preferable to have a structure where the conductive film containing aluminum as its main component is sandwiched between barrier films. A barrier film corresponds to a film having a function to suppress a hillock of the conductive film containing aluminum as its main component or to increase heat resistance, and chromium, tantalum, tungsten, molybdenum, titanium, silicon, nickel or nitride thereof can be given as an example of a material having such a function.

As an example of a structure of the conductive films 752 to 761, a structure where a titanium film, an aluminum film, and a titanium film are sequentially stacked over the substrate can be given. A titanium film is an element having a high reducing property; therefore, even when a thin natural oxide film is formed over the crystalline semiconductor film, the natural oxide film can be reduced so that preferable contact with the crystalline semiconductor film can be obtained. In addition, by performing high-density plasma treatment to the titanium film formed between the crystalline semiconductor film and the aluminum film in an atmosphere containing nitrogen, the surface is preferably nitrided. As the atmosphere containing nitrogen, a mixed gas of $N_2$ or $NH_3$ and a rare gas, or a mixed gas of $N_2$ or $NH_3$, a rare gas, and $H_2$ may be used. By nitriding the surface of the titanium film, titanium and aluminum are prevented from being alloyed in a subsequent step of heat treatment or the like, and aluminum can be prevented from being diffused in the crystalline semiconductor film by penetrating the titanium film. Although an example where the aluminum film is sandwiched between the titanium films is explained here, the same thing can be said for a case where a chromium film, a tungsten film, or the like is used instead of the titanium film. In a more preferable manner, film formation of the titanium film, nitriding treatment of the titanium film surface, film formation of the aluminum film, and film formation of the titanium film are performed continuously without being exposed to an atmosphere by using a multi chamber apparatus.

Subsequently, an insulating film 762 is formed so as to cover the conductive films 752 to 761 (FIG. 14B). The insulating film 762 is formed in a single layer or a stacked layer using an inorganic material or an organic material by an SOG method, a droplet discharge method, or the like. In this embodiment mode, the insulating film 762 is formed to have a thickness of 0.75 to 3 μm.

Then, the insulating film 762 is etched by a photolithography method to form a contact hole so as to expose the conductive film 761. Subsequently, a conductive film 763 is formed over the insulating film 762 and so as to fill the contact hole. Since this conductive film 763 functions as an antenna, the conductive film 763 is also hereinafter referred to as "an antenna". The conductive film 763 may have a layered structure without limiting to a single-layer structure.

The shape of the conductive film 763 functioning as an antenna will be described. As a transmission system of a signal in a semiconductor device capable of non-contact data transmission (RFID tag) including an antenna (conductive film 763), an electromagnetic coupling system, an electromagnetic induction system, a microwave system, or the like can be used. The transmission system can be appropriately selected by a practitioner by considering the usage mode, and the most suitable antenna in accordance with the transmission system is appropriately provided.

For example, in the case where an electromagnetic coupling system or an electromagnetic induction system (for example, a frequency of 13.56 MHz) is used as the transmission system of a signal in a semiconductor device, since electromagnetic induction due to the change of magnetic field density is utilized, the conductive film functioning as an antenna is formed with a loop shape (for example, a loop antenna) or a spiral shape.

In the case where a microwave system (for example, the UHF band (a frequency of 860 to 960 MHz)) is used as the transmission system of a signal in a semiconductor device, the shape such as the length of the conductive film functioning as an antenna may be appropriately set in consideration of a wavelength of an electromagnetic wave used in the transmission of the signal. For example, the conductive film 763 may be formed with a linear shape (for example, a dipole antenna) or a planar shape (for example, a patch antenna). In addition, the shape of the conductive film 763 is not limited to a linear shape and may have a curved shape, a meander shape, or a shape in which these shapes are combined in consideration of the wavelength of the electromagnetic wave.

Next, a formation method and a material of the conductive film 763 functioning as an antenna will be described. As the formation method of the conductive film 763, a CVD method, a sputtering method, a printing method such as screen printing or gravure printing, a droplet discharge method, a dispensing method, a plating method, or the like can be used. As the material of the conductive film 763, an element selected from aluminum (Al), titanium (Ti), silver (Ag), copper (Cu), gold (Au), platinum (Pt), nickel (Ni), palladium (Pd), tantalum (Ta) or molybdenum (Mo), or an alloy material or a compound material containing the element as its main component can be used. In addition, fine particles containing solder (preferably, Pb-free solder) as its main component may be used, and in this case, fine particles having a grain size of 20 μm or less are preferably used. Solder has an advantage of low cost. In addition, ceramic, ferrite, or the like can be used for the antenna.

For example, in the case of forming the conductive film 763 by a screen printing method, the conductive film 763 can be provided by selectively printing a conductive paste in which conductive particles having a grain size of several nm to several tens of μm are dissolved or dispersed in an organic resin. As the conductive particles, one or more metal particles of silver (Ag), gold (Au), copper (Cu), nickel (Ni), platinum (Pt), palladium (Pd), tantalum (Ta), molybdenum (Mo) or titanium (Ti), fine particles of silver halide, or dispersible nanoparticles can be used. In addition, as the organic resin included in the conductive paste, one or a plurality of organic resins functioning as a binder of metal particles, a solvent, a dispersant, or a coating agent can be used. Typically, an organic resin such as epoxy resin or silicon resin can be given. In addition, in forming the conductive film 763, it is preferable that baking be performed after pressing and pushing out the conductive paste. For example, in the case where fine particles containing silver as its main component (for example, a grain size of 1 nm or more and 100 nm or less) is used as a material of the conductive paste, the conductive film 763 can be formed by baking the paste at a temperature of 150 to 300° C. so as to be cured.

In addition, when an electromagnetic coupling system or an electromagnetic induction system is employed and a semiconductor device including an antenna (RFID tag) is provided in contact with a metal, it is preferable that a magnetic material having high permeability be provided between the semiconductor device and the metal. In the case where the semiconductor device including an antenna is provided in contact with a metal, eddy current flows into the metal in accordance with the change of magnetic field, the change of magnetic field becomes smaller due to the eddy current, and communication range is decreased. Accordingly, by providing the material having high permeability between the semiconductor device and the metal, eddy current to the metal can be suppressed and the decrease of the communication range can be suppressed. Note that ferrite or a thin metal film, which has high permeability and small radio frequency loss, can be used as the magnetic material.

Through the above-described process, an element layer is completed.

Figure 16:
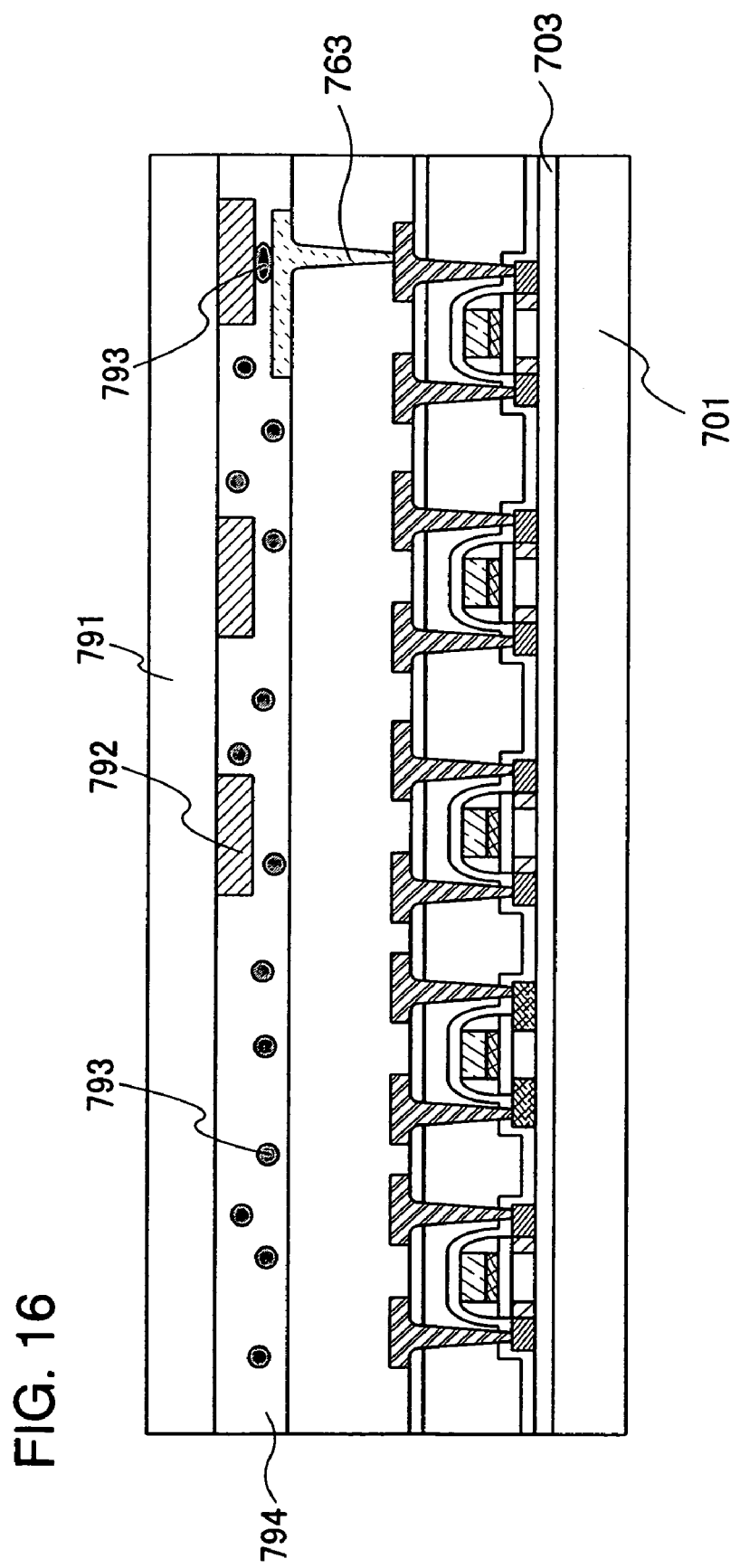
FIG. 16 shows a manufacturing method of a semiconductor device of the present invention (Embodiment Mode 3)

In this embodiment mode, a structure where the antenna (conductive film 763) is formed as a part of the element layer is described; however, a substrate provided with an antenna may be newly prepared and a structure in which the substrate provided with the antenna and the substrate provided with the element layer are attached may be employed. In other words, as shown in FIG. 16, a substrate 791 provided with an antenna 792 and the substrate 701 provided with the element layer may be attached. In FIG. 16, an anisotropic conductive material is used as an attachment means. The anisotropic conductive material contains conductive particles 793 and a fluid, and the fluid is cured by baking or light irradiation to become an attachment layer 794. The conductive film 763 and the antenna 792 can obtain conductivity due to pressure-bonding of the conductive particles 793. In other regions, since the conductive particles 793 have a sufficient distance therebetween, electrical connection is not obtained. Other than the method for attachment by using the anisotropic conductive material, a method of bonding a metal and a metal by using ultrasonic waves (referred to as ultrasonic bonding) or a method for attachment by using ultraviolet curable resin or a two-sided tape can also be employed. As the substrate 791 provided with the antenna 792, a film containing polypropylene, polyester, vinyl, polyvinyl fluoride, vinyl chloride, or the like, paper containing a fibrous material, or the like can be used. In FIG. 16, the conductive film 763 functions as a wire for electrically connecting the antenna 792 and the thin film transistor.

Figure 15:
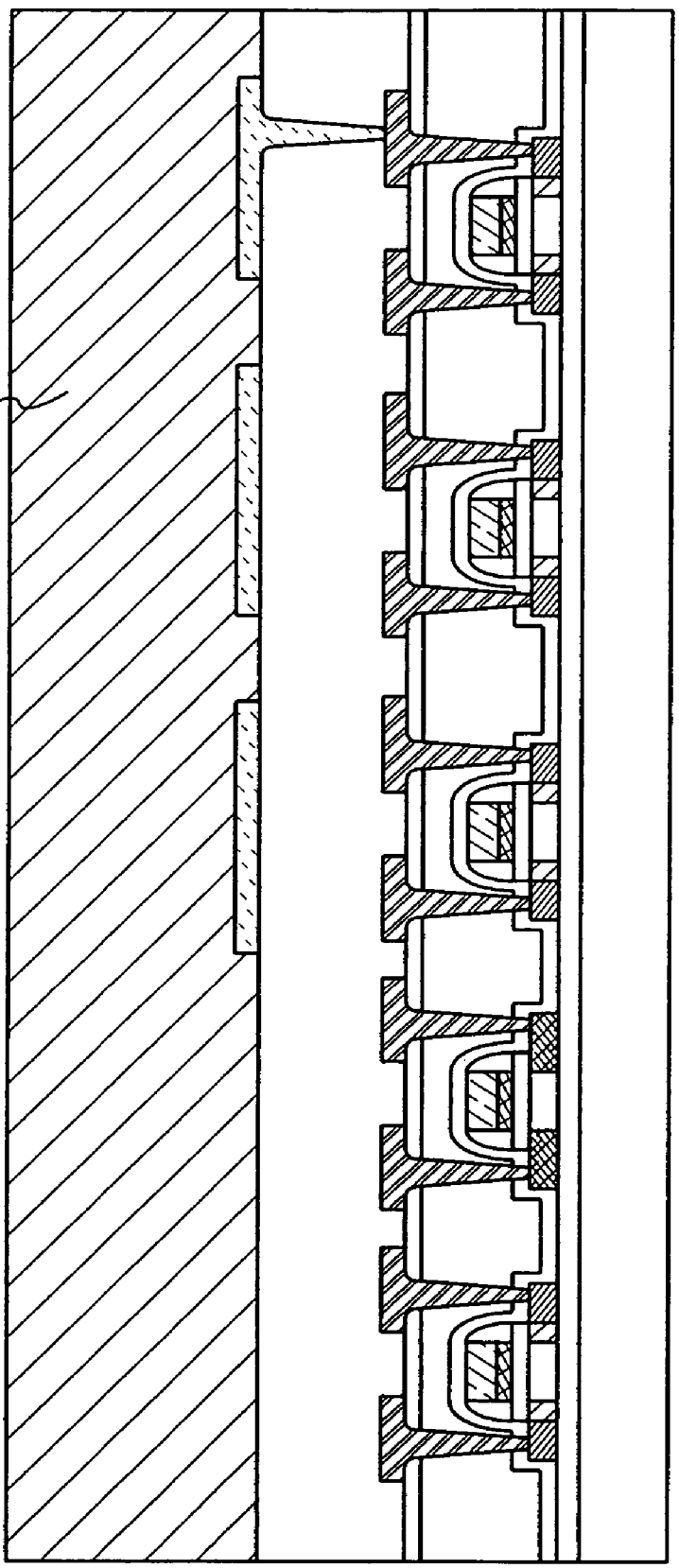
FIG. 15 shows a manufacturing method of a semiconductor device of the present invention (Embodiment Mode 3)

Next, an insulating film 772 is formed by an SOG method, a droplet discharge method, or the like, so as to cover the wire 763 functioning as an antenna (FIG. 15). The insulating film 772 functions as a protective layer for securing strength of the element layer. The insulating film 772 is preferably formed so as to cover lateral faces of the base film 703 and the element layer as well. In this embodiment mode, the insulating film 772 is entirely formed over the base film 703 and the element layer; however, the insulating film 772 is not necessarily formed entirely, and may be formed selectively. The present invention can be implemented even when the insulating film 772 is not provided.

The insulating film 772 may be formed by using a film containing carbon such as DLC (diamond like carbon), a silicon oxide film containing nitrogen, a silicon nitride film containing oxygen, a film containing an organic material (for example, a film containing a resin material such as epoxy), or the like. As a formation method of the insulating film 772, a sputtering method, various CVD methods such as a plasma CVD method, a spin coating method, a droplet discharge method, or a screen printing method can be used.

The method described in Embodiment Mode 1 can be employed in subsequent steps after forming the insulating film (protective layer) 772 to form a semiconductor device (chip); accordingly, the explanation for the steps is herein omitted.

This embodiment mode can be implemented by freely combining with any of the above-described embodiment modes. In other words, the material or the formation method described in the above-described embodiment modes can be used in this embodiment mode, and the material or the formation method described in this embodiment mode can be used in the above-described embodiment modes.

Embodiment Mode 4

In Embodiment Mode 4, one mode in the case of utilizing a semiconductor device of the present invention as an RFID tag capable of contactless data transmission and reception will be described with reference to FIGS. 17A to 17C.

Figure 17A:
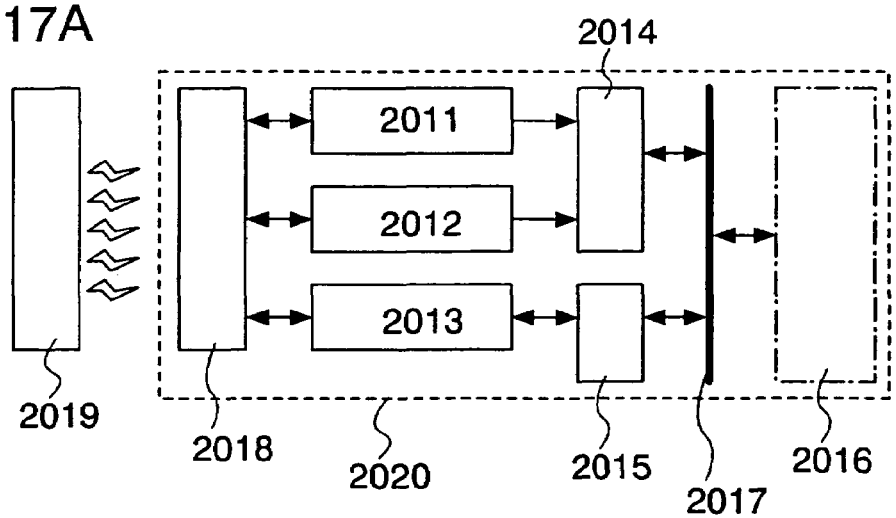
FIGS. 17A to 17C explain usage modes of a semiconductor device of the present invention (Embodiment Mode 4)
Figure 17B:
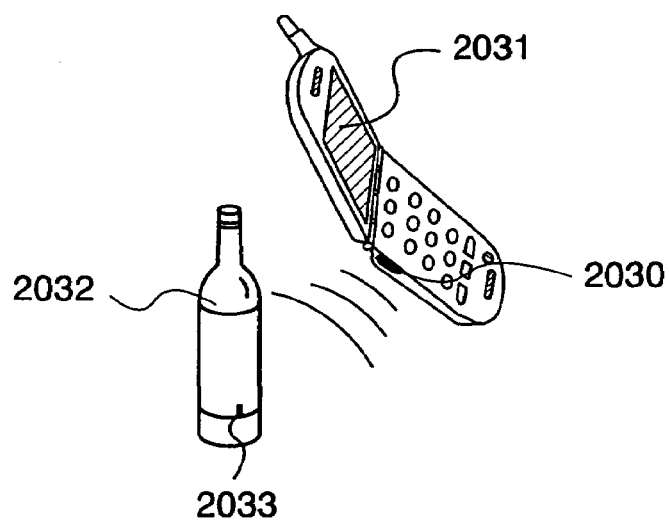
Figure 17C:
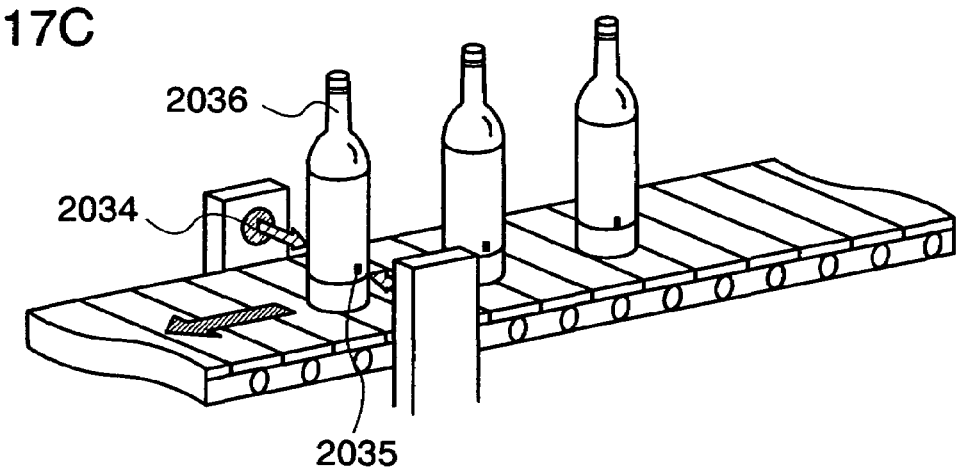

An RFID tag 2020 has a function of contactless data communication, and includes a power supply circuit 2011, a clock generation circuit 2012, data demodulation/modulation circuit 2013, control circuit 2014 for controlling other circuits, an interface circuit 2015, a memory 2016, a data bus 2017, and an antenna (antenna coil) 2018 (FIG. 17A).

The power supply circuit 2011 generates various kinds of power to be supplied to each circuit in the semiconductor device, based on an AC signal input from the antenna 2018. The clock generation circuit 2012 generates various clock signals to be supplied to each circuit in the semiconductor device, based on the AC signal input from the antenna 2018. The data demodulation/modulation circuit 2013 has a function to demodulate/modulate data to communicate with a reader/writer 2019. The control circuit 2014 has a function to control the memory 2016. The antenna 2018 has a function to transmit and receive electromagnetic waves. The reader/writer 2019 controls communication with the semiconductor device and the process regarding the data thereof. An RFID tag is not limited to the aforementioned structure and, for example, may be additionally provided with other elements such as a limiter circuit of power supply voltage and a decoding hardware.

As for the RFID tag, a type in which power supply voltage is supplied to each circuit by electric waves without mounting a power supply (battery); another type in which power supply voltage is supplied to each circuit by mounting a power supply (battery) instead of an antenna; or still another type in which power supply voltage is supplied by radio waves and a power supply may be used.

It is advantageous to use a semiconductor device of the present invention for an RFID tag or the like, since non-contact communication is possible; multiple reading is possible; writing of data is possible; processing into various shapes is possible; directivity is wide and a wide recognition range is provided depending on the selected frequency; and the like. The RFID tag can be applied to an IC tag which can identify individual information of a person or an article with non-contact wireless communication, a label which is enabled to be attached to an article by label processing, a wristband for an event or an amusement, or the like. In addition, the RFID tag may be processed with a resin material or may be directly fixed to a metal which obstructs wireless communication. Further, the RFID tag can be utilized for the operation of a system such as an entering-leaving management system or a checkout system.

Next, one mode of actually using the semiconductor device of the present invention as the RFID tag will be explained. A reader/writer 2030 is provided on a side of a portable terminal including a display area 2031, and an RFID tag 2033 is provided on a side of an article 2032 (FIG. 17B). The RFID tag 2033 manufactured in accordance with the present invention has flexibility. Therefore, the RFID tag 2033 can be easily provided on a curved surface of the article 2032. When the reader/writer 2030 is held to the RFID tag 2033 provided on the article 2032, information relating to a product, such as a raw material and a place of origin of the article, a test result in each production process, a history of distribution process, or further, description of the product is displayed in the display area 2031. In addition, a product 2036 can be inspected by using a reader/writer 2034 and an RFID tag 2035 provided on the product 2036 when the product 2036 is transported with a conveyor belt (FIG. 17C). The RFID tag 2035 manufactured in accordance with the present invention has flexibility. Therefore, the RFID tag 2035 can be easily provided on a curved surface of the product 2036. In this manner, information can be easily obtained, and high functions and high added values are realized by utilizing an RFID tag for a system.

This embodiment mode can be implemented by freely combining with any of the above-described embodiment modes.

Embodiment Mode 5

The semiconductor device according to the present invention can be utilized as an RFID tag. For example, the semiconductor device can be used by being provided on paper money, coin, securities, certificates, bearer bonds, packing containers, documents, recording media, commodities, vehicles, foods, garments, health articles, livingwares, medicines, electronic devices, and the like. These examples will be explained with reference to FIGS. 18A to 18H. Reference numeral 2720 in FIGS. 18A to 18H denotes an RFID tag. The RFID tag manufactured in accordance with the present invention has flexibility. Therefore, the RFID tag can be easily provided to articles having various shapes as shown in FIGS. 18A to 18H. In addition, since the RFID tag is thinned, the design of the article is hard to be degraded.

Figure 18A:
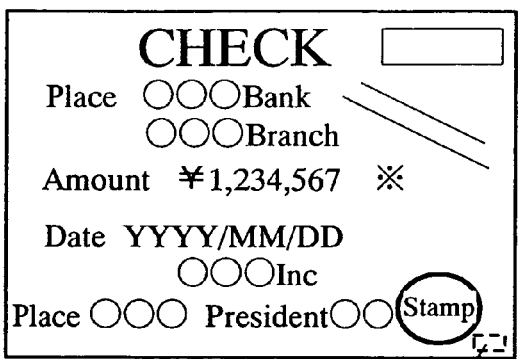
FIGS. 18A to 18H explain usage modes of a semiconductor device of the present invention (Embodiment Mode 5).
Figure 18C:
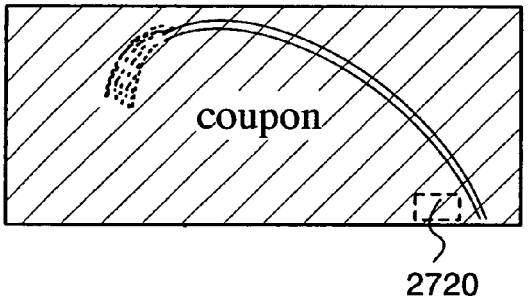
Figure 18E:
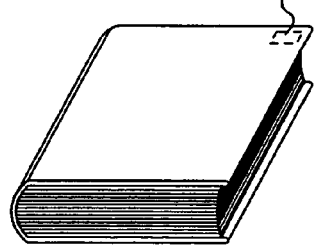
Figure 18G:
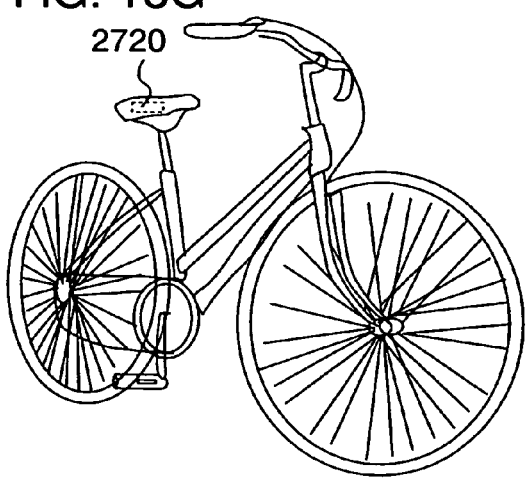
Figure 18B:
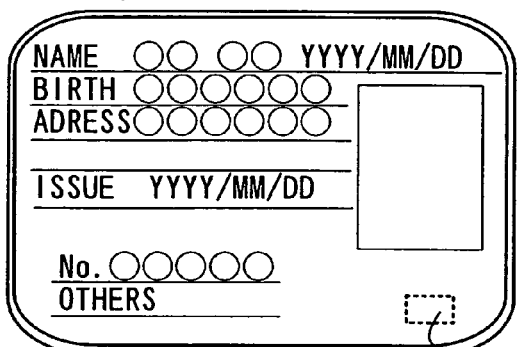
Figure 18D:
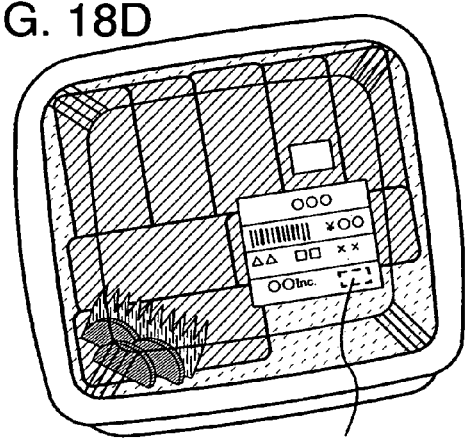
Figure 18F:
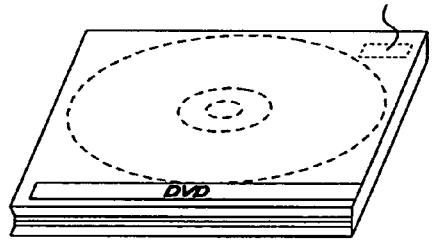
Figure 18H:
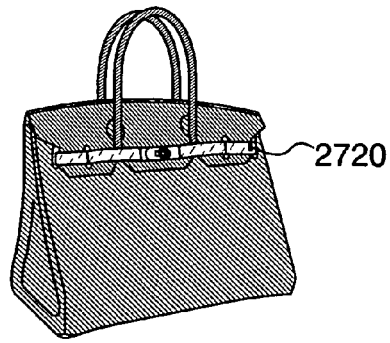

The paper money and coins are money distributed in the market and includes currency (cash vouchers) available in a certain area in a similar way to money, memorial coins, and the like. The securities refer to checks, stock certificates, promissory notes, and the like (FIG. 18A). The certificates refer to licenses such as driver's licenses, certificates of residence, and the like (FIG. 18B). The bearer bonds refer to stamps, rice coupons, various merchandise coupons, and the like (FIG. 18C). The packing containers refer to wrapping paper for a box lunch or the like, plastic bottles, and the like (FIG. 18D). The documents refer to volumes, books, and the like (FIG. 18E). The recording media refer to DVD software, video tapes, and the like (FIG. 18F). The vehicles refer to wheeled vehicles such as bicycles, vessels, and the like (FIG. 18G). The commodities refer to bags, glasses, and the like (FIG. 18H). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic devices refer to liquid crystal display devices, EL display devices, television devices (TV sets or flat-screen TV sets), cellular phones, and the like.

Counterfeits can be prevented by providing an RFID tag on the paper money, coin, securities, certificates, bearer bonds, and the like. The efficiency of an inspection system or a system used in a rental shop can be improved by providing an RFID tag on packing containers, documents, recording media, commodities, foods, livingwares, electronic devices, or the like. By providing an RFID tag on each of the vehicles, health articles, medicines, and the like, counterfeits or theft can be prevented. Further in the case of providing the RFID tag on medicines, medicines can be prevented from being taken mistakenly. The RFID tag is provided on goods by being attached on their surfaces or embedded thereinto. For example, the RFID tag may be embedded in a paper in the case of a book or embedded in an organic resin in the case of a package formed of the organic resin.

The efficiency of an inspection system, a system used in a rental shop, or the like can be improved by providing an RFID tag on packing containers, recording media, commodities, foods, garments, livingwares, electronic devices, or the like. Counterfeits or theft can be prevented by providing an RFID tag on the vehicles. Individual creatures can be easily identified by implanting an RFID tag in creatures such as animals. For example, year of birth, sex, breed, and the like can be easily identified by implanting an RFID tag in creatures such as domestic animals.

As described above, a semiconductor device according to the present invention can be provided on anything as long as they are goods. This embodiment mode can be implemented by freely combining with any of the above embodiment modes.

What is claimed is:

1. A manufacturing method of a semiconductor device, comprising the steps of:
   forming an element layer including a plurality of integrated circuits over one surface of a substrate;
   forming a protective layer including a resin so as to cover at least a side surface of the substrate and a side surface of the element layer;
   grinding the other surface of the substrate;
   polishing the ground other surface of the substrate;
   removing the protective layer; and
   dividing the polished substrate and the element layer to form stack bodies including a layer provided with at least one of the plurality of integrated circuits.

2. A manufacturing method of a semiconductor device, comprising the steps of:
   forming an element layer including, a plurality of integrated circuits over one surface of a substrate;
   forming a protective layer including a resin so as to cover at least a side surface of the substrate and a side surface of the element layer;
   grinding the other surface of the substrate;
   polishing the ground other surface of the substrate;
   washing the polished other surface of the substrate;
   drying the washed other surface of the substrate;
   removing the protective layer; and
   dividing the dried substrate and the element layer so as to form stack bodies including a layer provided with at least one of the plurality of integrated circuits.

3. A manufacturing method of a semiconductor device, comprising the steps of:
   forming an element layer including a plurality of integrated circuits over one surface of a substrate;
   forming a protective layer including a resin so as to cover the other surface of the and substrate a side surface of the substrate and a side surface of the element layer;
   grinding the other surface of the substrate;
   polishing the ground other surface of the substrate;
   removing the protective layer; and
   dividing the polished substrate and the element layer so as to form stack bodies including a layer provided with at least one of the plurality of integrated circuits.

4. The manufacturing method of a semiconductor device according to claim 1, wherein one surface or both surfaces of the stack bodies is/are sealed by using a flexible film.

5. The manufacturing method of a semiconductor device according to claim 2, wherein one surface or both surfaces of the stack bodies is/are sealed by using a flexible film.

6. The manufacturing method of a semiconductor device according to claim 3, wherein one surface or both surfaces of the stack bodies is/are sealed by using a flexible film.

7. A manufacturing method of a semiconductor device, comprising the steps of:
   forming an element layer including a plurality of integrated circuits over onesurface of a substrate;
   dividing the substrate and the element layer so as to form stack bodies including a layer provided with at least one of the plurality of integrated circuits;
   forming a protective layer including a resin so as to cover at least a side surface of the stack bodies;
   grinding the other surface of the substrate in the stack bodies;
   polishing the ground other surface of the substrate; and
   removing the protective layer.

8. A manufacturing method of a semiconductor device, comprising the steps of:
   forming an element layer including a plurality of integrated circuits over one surface of a substrate;
   dividing the substrate and the element layer so as to form stack bodies including a layer provided with at least one of the plurality of integrated circuits;
   forming a protective layer including a resin so as to cover the other surface of the substrate in the stack bodies and side surfaces of the stack bodies;
   grinding the other surface of the substrate in the stack bodies;
   polishing the ground other surface of the substrate; and
   removing the protective layer.

9. The manufacturing method of a semiconductor device according to claim 1, wherein the protective layer is formed by a screen printing method, a spin coating method, a droplet discharge method, or a dispensing method.

10. The manufacturing method of a semiconductor device according to claim 2, wherein the protective layer is formed by a screen printing method, a spin coating method, a droplet discharge method, or a dispensing method.

11. The manufacturing method of a semiconductor device according to claim 3, wherein the protective layer is formed by a screen printing method, a spin coating method, a droplet discharge method, or a dispensing method.

12. The manufacturing method of a semiconductor device according to claim 7, wherein the protective layer is formed by a screen printing method, a spin coating method, a droplet discharge method, or a dispensing method.

13. The manufacturing method of a semiconductor device according to claim 8, wherein the protective layer is formed by a screen printing method, a spin coating method, a droplet discharge method, or a dispensing method.

14. The manufacturing method of a semiconductor device according to claim 1, wherein a reversible material is used for the protective layer.

15. The manufacturing method of a semiconductor device according to claim 2, wherein a reversible material is used for the protective layer.

16. The manufacturing method of a semiconductor device according to claim 3, wherein a reversible material is used for the protective layer.

17. The manufacturing method of a semiconductor device according to claim 7, wherein a reversible material is used for the protective layer.

18. The manufacturing method of a semiconductor device according to claim 8, wherein a reversible material is used for the protective layer.

19. The manufacturing method of a semiconductor device according to claim 1, wherein hot-melt wax or UV peeling resin is used for the protective layer.

20. The manufacturing method of a semiconductor device according to claim 2, wherein hot-melt wax or UV peeling resin is used for the protective layer.

21. The manufacturing method of a semiconductor device according to claim 3, wherein hot-melt wax or UV peeling resin is used for the protective layer.

22. The manufacturing method of a semiconductor device according to claim 7, wherein hot-melt wax or UV peeling resin is used for the protective layer.

23. The manufacturing method of a semiconductor device according to claim 8, wherein hot-melt wax or UV peeling resin is used for the protective layer.

24. The manufacturing method of a semiconductor device according to claim 1, wherein the thickness of the polished substrate is 2 μm or more and 50 μm or less.

25. The manufacturing method of a semiconductor device according to claim 2, wherein the thickness of the polished substrate is 2 μm or more and 50 μmor less.

26. The manufacturing method of a semiconductor device according to claim 3, wherein the thickness of the polished substrate is 2 μm or more and 50 μm or less.

27. The manufacturing method of a semiconductor device according to claim 7, wherein the thickness of the polished substrate is 2 μm or more and 50 μm or less.

28. The manufacturing method of a semiconductor device according to claim 8, wherein the thickness of the polished substrate is 2 μm or more and 50 μm or less.

29. A manufacturing method of a semiconductor device, comprising the steps of:
    forming an element layer including a plurality of integrated circuits over onesurface of a substrate;
    forming a protective layer including a resin so as to cover at least a side surface of the substrate and a side surface of the element layer;
    thinning the substrate;
    removing the protective layer; and
    dividing the substrate and the element layer to form stack bodies including a layer provided with at least one of the plurality of integrated circuits.

30. The manufacturing method of a semiconductor device according to claim 29, wherein one surface or both surfaces of the stack bodies is/are sealed by using a flexible film.

31. The manufacturing method of a semiconductor device according to claim 29, wherein the protective layer is formed by a screen printing method, a spin coating method, a droplet discharge method, or a dispensing method.

32. The manufacturing method of a semiconductor device according to claim 29, wherein a reversible material is used for the protective layer.

33. The manufacturing method of a semiconductor device according to claim 29, wherein hot-melt wax or UV peeling resin is used for the protective layer.

34. The manufacturing method of a semiconductor device according to claim 29, wherein the thickness of the substrate is 2 μm or more and 50 μm or less.

35. The manufacturing method of a semiconductor device according to claim 1, wherein the stack bodies include a part of the polished substrate.

36. The manufacturing method of a semiconductor device according to claim 2, wherein the stack bodies include a part of the dried substrate.

37. The manufacturing method of a semiconductor device according to claim 3, wherein the stack bodies include a part of the polished substrate.

38. The manufacturing method of a semiconductor device according to claim 7, wherein the stack bodies include a part of the polished substrate.

39. The manufacturing method of a semiconductor device according to claim 8, wherein the stack bodies include a part of the polished substrate.

40. The manufacturing method of a semiconductor device according to claim 29, wherein the stack bodies include a part of the substrate.

* * * * *